United States Patent
Kato et al.

(10) Patent No.: US 11,256,278 B2
(45) Date of Patent: Feb. 22, 2022

(54) POWER SYSTEM STABILIZATION DEVICE AND POWER SYSTEM STABILIZATION METHOD

(71) Applicant: Hitachi, Ltd., Tokyo (JP)

(72) Inventors: Daichi Kato, Tokyo (JP); Masahiro Yatsu, Tokyo (JP)

(73) Assignee: HITACHI, LTD., Tokyo (JP)

( * ) Notice: Subject to any disclaimer, the term of this patent is extended or adjusted under 35 U.S.C. 154(b) by 78 days.

(21) Appl. No.: 16/490,649

(22) PCT Filed: Jan. 24, 2018

(86) PCT No.: PCT/JP2018/002114
§ 371 (c)(1),
(2) Date: Sep. 3, 2019

(87) PCT Pub. No.: WO2018/186001
PCT Pub. Date: Oct. 11, 2018

(65) Prior Publication Data
US 2019/0391609 A1    Dec. 26, 2019

(30) Foreign Application Priority Data

Apr. 7, 2017 (JP) .............................. JP2017-076535

(51) Int. Cl.
*G05F 1/66* (2006.01)
*G01R 21/01* (2006.01)
(Continued)

(52) U.S. Cl.
CPC .............. *G05F 1/66* (2013.01); *G01R 21/01* (2013.01); *G01R 21/133* (2013.01); *H02J 3/38* (2013.01)

(58) Field of Classification Search
CPC .......... G05F 1/66; G01R 21/01; G01R 21/133
See application file for complete search history.

(56) References Cited

U.S. PATENT DOCUMENTS 10,473,700 B2 * 11/2019 Kuroda ................... H02J 3/24
2017/0045558 A1   2/2017 Kuroda et al.
(Continued)

FOREIGN PATENT DOCUMENTS

JP   2013-059217 A    3/2013
WO  2015/163121 A1   10/2015

OTHER PUBLICATIONS

International Search Report of PCT/JP2018/002114 dated Feb. 27, 2018.
(Continued)

*Primary Examiner* — Nguyen Tran
*Assistant Examiner* — Afework S Demisse
(74) *Attorney, Agent, or Firm* — Mattingly & Malur, PC

(57) ABSTRACT

In a power system stabilization device and power system stabilization method, an excess/shortage of control is prevented and an appropriate control suitable for the system state is enabled. A power system stabilization device including a central processing unit in which there is determined, in advance, a device subject to control necessary to maintain stability when an assumed failure in a power system including renewable energy occurs, wherein the central processing unit executes, for each of a plurality of assumed failures, a computation for determining a subject of control necessary to maintain stability at the time of the assumed failure, and determines, in accordance with an output fluctuation scenario for renewable energy pertaining to the weather, the degree of priority of performing a computation for determining a subject of control necessary to maintain stability at the time of each of the assumed failures.

9 Claims, 28 Drawing Sheets

(51) Int. Cl.
*G01R 21/133* (2006.01)
*H02J 3/38* (2006.01)

(56) References Cited

U.S. PATENT DOCUMENTS

2019/0052082 A1* 2/2019 Zheng .................. H02J 3/18
2019/0074693 A1* 3/2019 Kudo .................. H02J 3/382

OTHER PUBLICATIONS

Extended European Search Report received in corresponding European Application No. 18781404.1 dated Nov. 30, 2020.

* cited by examiner

[FIG. 1]
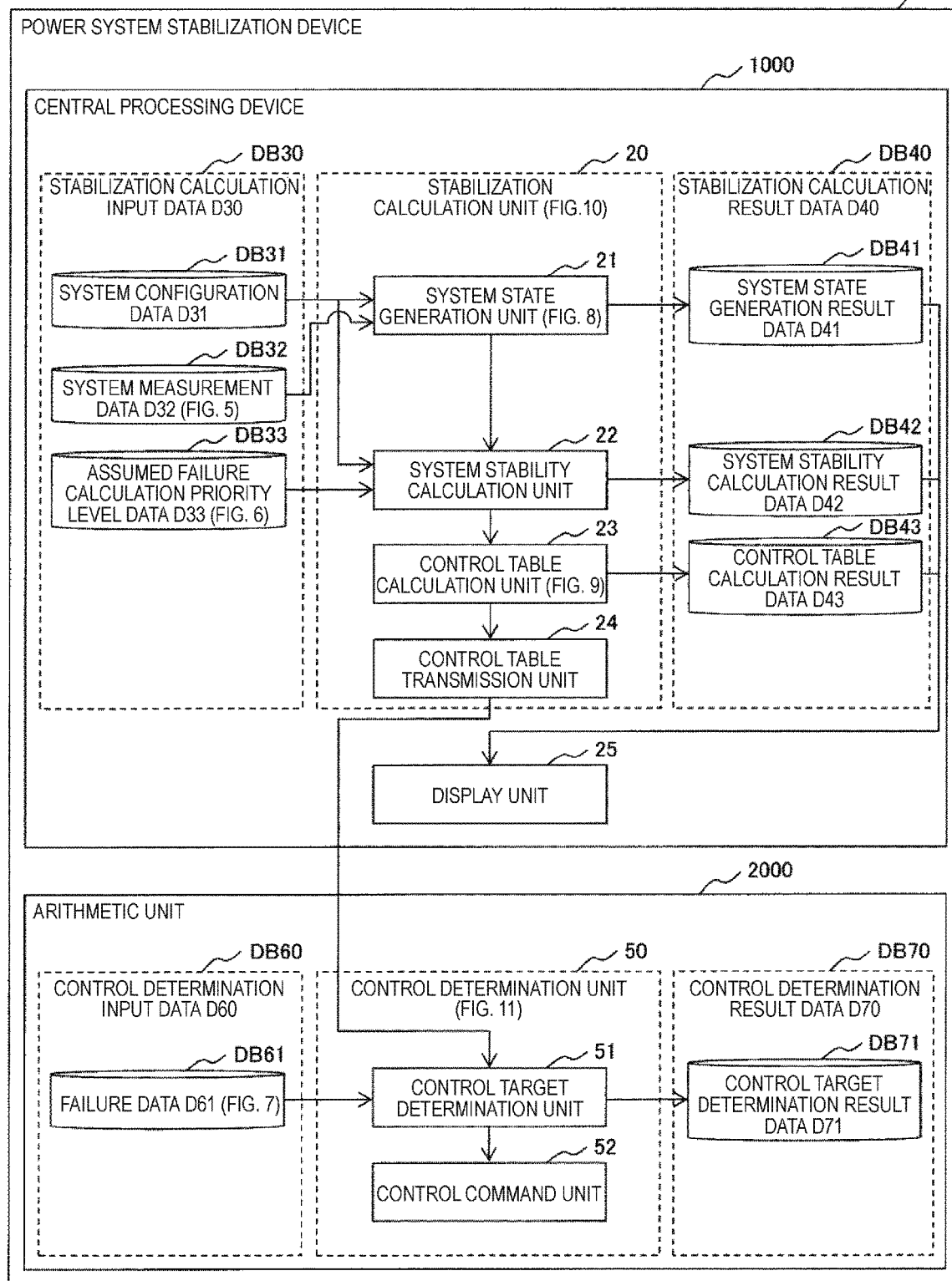

[FIG. 2]
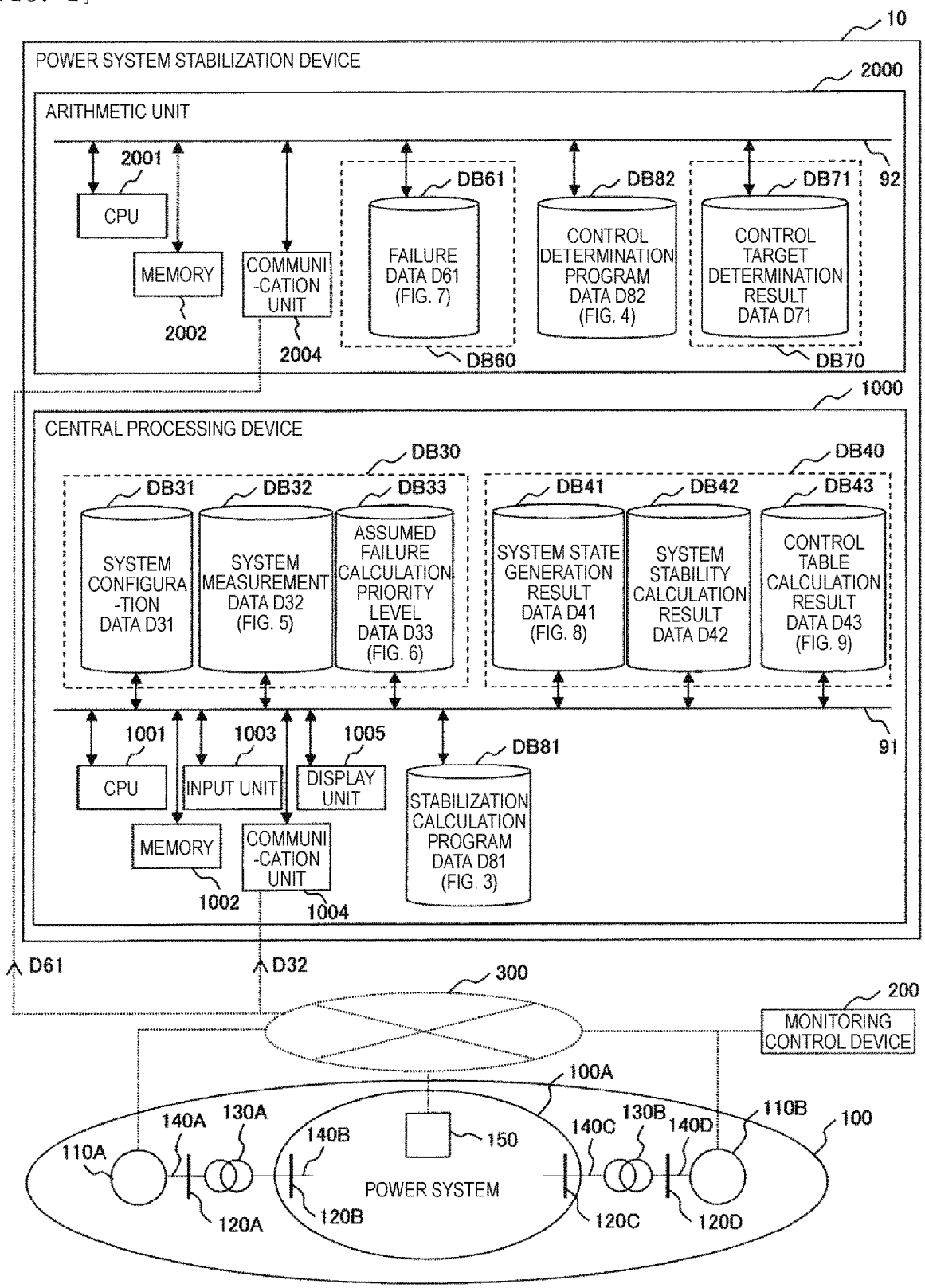

[FIG. 3]
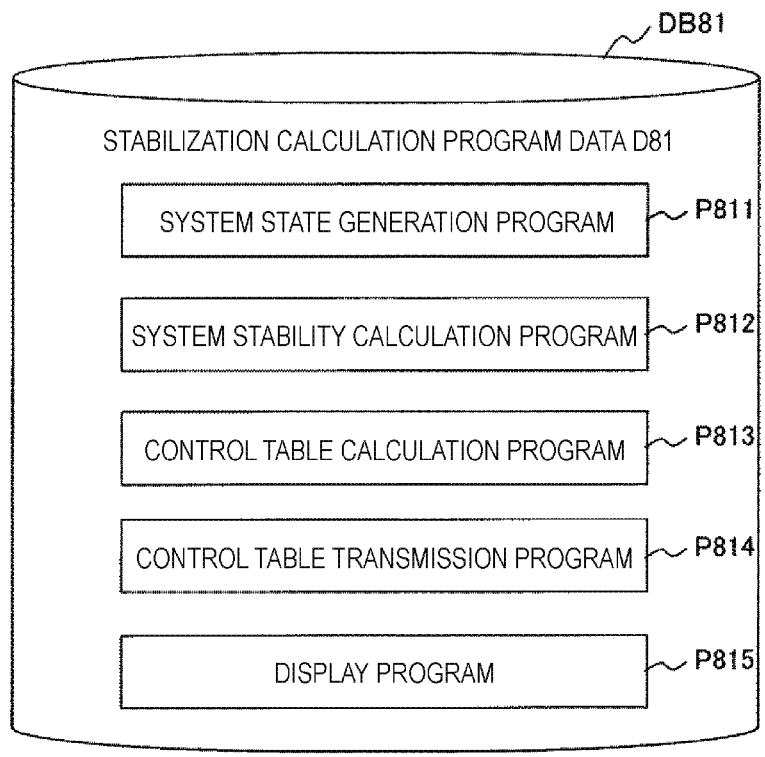
[FIG. 4]
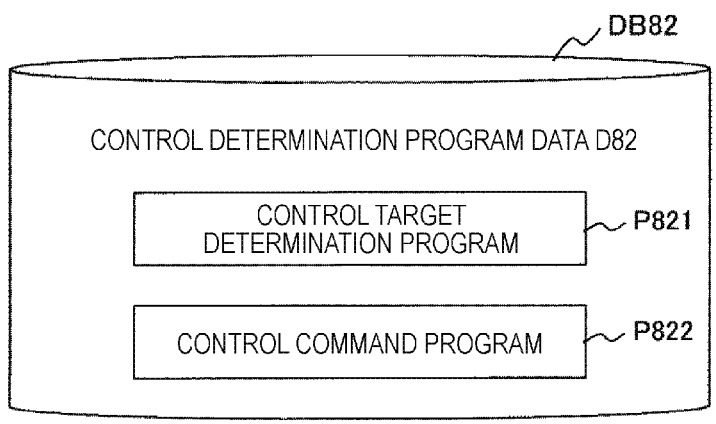

| LOCATION | TYPE | VALUE (p.u.) |
|---|---|---|
| TRANSMISSION LINE A (TRANSMISSION END) | P | 1.0 |
| | Q | 0.8 |
| TRANSMISSION LINE A (RECEPTION END) | P | 0.9 |
| | Q | 0.6 |
| TRANSMISSION LINE B (TRANSMISSION END) | P | 1.1 |
| | Q | 0.9 |
| ... | ... | ... |
| BUS LINE A | V | 1.01 |
| BUS LINE B | V | 0.99 |
| ... | ... | ... |

RENEWABLE ENERGY OUTPUT FLUCTUATION SCENARIO A — DB33

| PRIORITY LEVEL | FAILURE TYPE | |
|---|---|---|
| | FAILURE LOCATION | FAILURE MODE |
| 1 | TRANSMISSION LINE A (TRANSMISSION END) | 3φ6LG(ABCA'B'C') |
| 2 | TRANSMISSION LINE B (RECEPTION END) | 3φ6LG(ABCA'B'C') |
| 3 | TRANSMISSION LINE D (TRANSMISSION END) | 3φ6LG(ABCA'B'C') |
| 4 | TRANSMISSION LINE A (TRANSMISSION END) | 3φ4LG(ABB'C') |
| 5 | TRANSMISSION LINE B (RECEPTION END) | 3φ4LG(ABB'C') |
| 6 | TRANSMISSION LINE D (TRANSMISSION END) | 3φ4LG(ABB'C') |
| 7 | TRANSMISSION LINE C (RECEPTION END) | 3φ6LG(ABCA'B'C') |
| 8 | TRANSMISSION LINE E (TRANSMISSION END) | 3φ6LG(ABCA'B'C') |
| ⋮ | ⋮ | ⋮ |

| RENEWABLE ENERGY OUTPUT FLUCTUATION SCENARIO TYPE | CONTENT | | | |
|---|---|---|---|---|
| | LOCATION A | | LOCATION B | |
| | WEATHER | WIND SPEED (m/s) | WEATHER | WIND SPEED (m/s) |
| A | SUNNY PARTLY CLOUDY | 0 | SUNNY PARTLY CLOUDY | 0 |
| B | ⋮ | ⋮ | ⋮ | ⋮ |
| C | ⋮ | ⋮ | ⋮ | ⋮ |

| FAILURE LOCATION | FAILURE MODE |
|---|---|
| TRANSMISSION LINE A (TRANSMISSION END) | 3φ6LG(ABCA'B'C') |

[FIG. 8]

| TARGET BUS LINE | TYPE | VALUE(p.u.) |
|---|---|---|
| GENERATOR G1 BUS LINE | P | 1.0 |
|  | V | 1.0 |
| GENERATOR G2 BUS LINE | P | 1.0 |
|  | V | 1.0 |
| GENERATOR G3 BUS LINE | P | 1.0 |
|  | V | 1.0 |
| ⋮ | ⋮ | ⋮ |
| LOAD L1 BUS LINE | P | 0.5 |
|  | Q | 0.5 |
| LOAD L2 BUS LINE | P | 0.5 |
|  | Q | 0.5 |
| ⋮ | ⋮ | ⋮ |

| PRIORITY LEVEL | FAILURE TYPE | | CONTROL TARGET |
|---|---|---|---|
|  | FAILURE LOCATION | FAILURE MODE |  |
| 1 | TRANSMISSION LINE A (TRANSMISSION END) | 3φ6LG(ABCA'B'C') | GENERATOR G1 + G2 + G3 + G4 |
| 2 | TRANSMISSION LINE B (RECEPTION END) | 3φ6LG(ABCA'B'C') | GENERATOR G1 + G2 + G3 + G4 |
| 3 | TRANSMISSION LINE D (TRANSMISSION END) | 3φ6LG(ABCA'B'C') | GENERATOR G1 + G2 + G3 + G4 |
| 4 | TRANSMISSION LINE A (TRANSMISSION END) | 3φ4LG(ABB'C') | GENERATOR G1 + G2 + G3 |
| 5 | TRANSMISSION LINE B (RECEPTION END) | 3φ4LG(ABB'C') | GENERATOR G1 + G2 + G3 |
| 6 | TRANSMISSION LINE D (TRANSMISSION END) | 3φ4LG(ABB'C') | GENERATOR G1 + G2 + G3 |
| 7 | TRANSMISSION LINE C (RECEPTION END) | 3φ6LG(ABCA'B'C') | GENERATOR G1 + G2 + G3 |
| 8 | TRANSMISSION LINE E (TRANSMISSION END) | 3φ6LG(ABCA'B'C') | GENERATOR G1 + G2 + G3 |
| ⋮ | ⋮ | ⋮ | ⋮ |

D431, D432, D433  DB43

[FIG. 10]
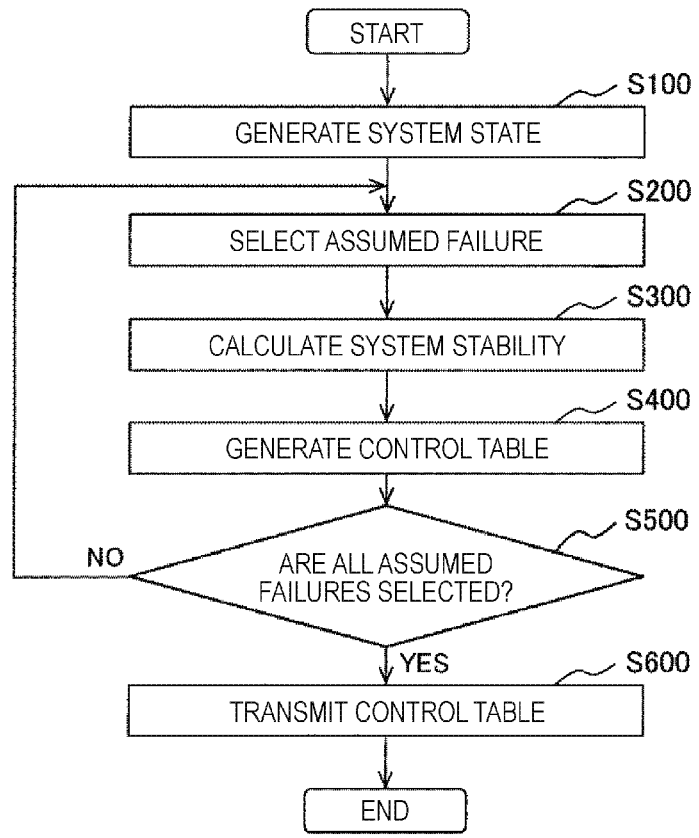
[FIG. 11]
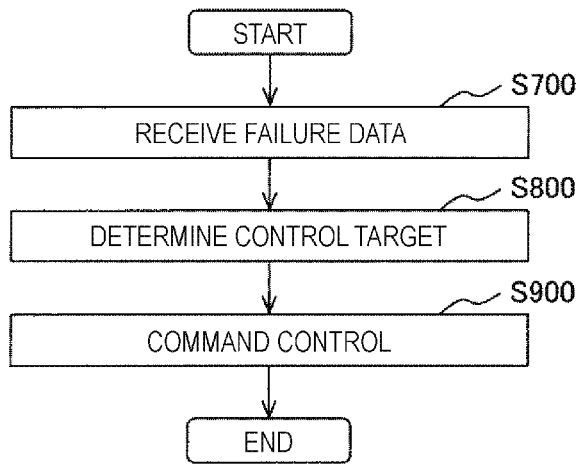

[FIG. 12]

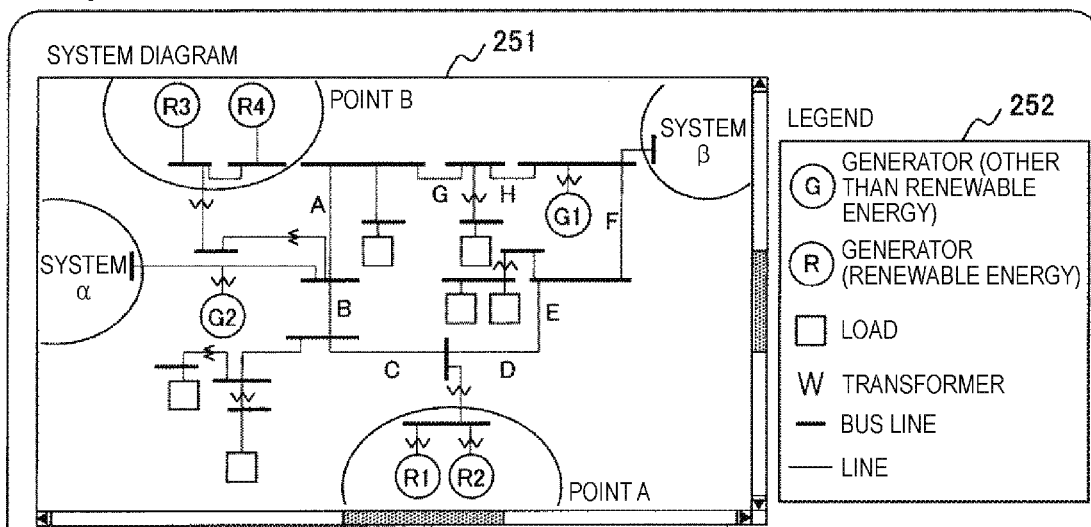

STABILIZATION CALCULATION RESULT — 253

| PRIORITY LEVEL | FAILURE TYPE | | CONTROL TARGET |
|---|---|---|---|
| | FAILURE LOCATION | FAILURE MODE | |
| 1 | TRANSMISSION LINE A (TRANSMISSION END) | 3φ6LG(ABCA'B'C') | GENERATOR G1 + G2 + G3 + G4 |
| 2 | TRANSMISSION LINE B (RECEPTION END) | 3φ6LG(ABCA'B'C') | GENERATOR G1 + G2 + G3 + G4 |
| 3 | TRANSMISSION LINE D (TRANSMISSION END) | 3φ6LG(ABCA'B'C') | GENERATOR G1 + G2 + G3 + G4 |
| 4 | TRANSMISSION LINE A (TRANSMISSION END) | 3φ4LG(ABB'C') | GENERATOR G1 + G2 + G3 |
| 5 | TRANSMISSION LINE B (RECEPTION END) | 3φ4LG(ABB'C') | GENERATOR G1 + G2 + G3 |
| 6 | TRANSMISSION LINE D (TRANSMISSION END) | 3φ4LG(ABB'C') | GENERATOR G1 + G2 + G3 |
| 7 | TRANSMISSION LINE C (RECEPTION END) | 3φ6LG(ABCA'B'C') | GENERATOR G1 + G2 + G3 |
| 8 | TRANSMISSION LINE E (TRANSMISSION END) | 3φ6LG(ABCA'B'C') | GENERATOR G1 + G2 + G3 |

RENEWABLE ENERGY OUTPUT FLUCTUATION SCENARIO

POINT [A ▽]   WEATHER [PARTLY CLOUDY]   WIND SPEED (m/s) [0]
       254                    255                        256

[FIG. 13]
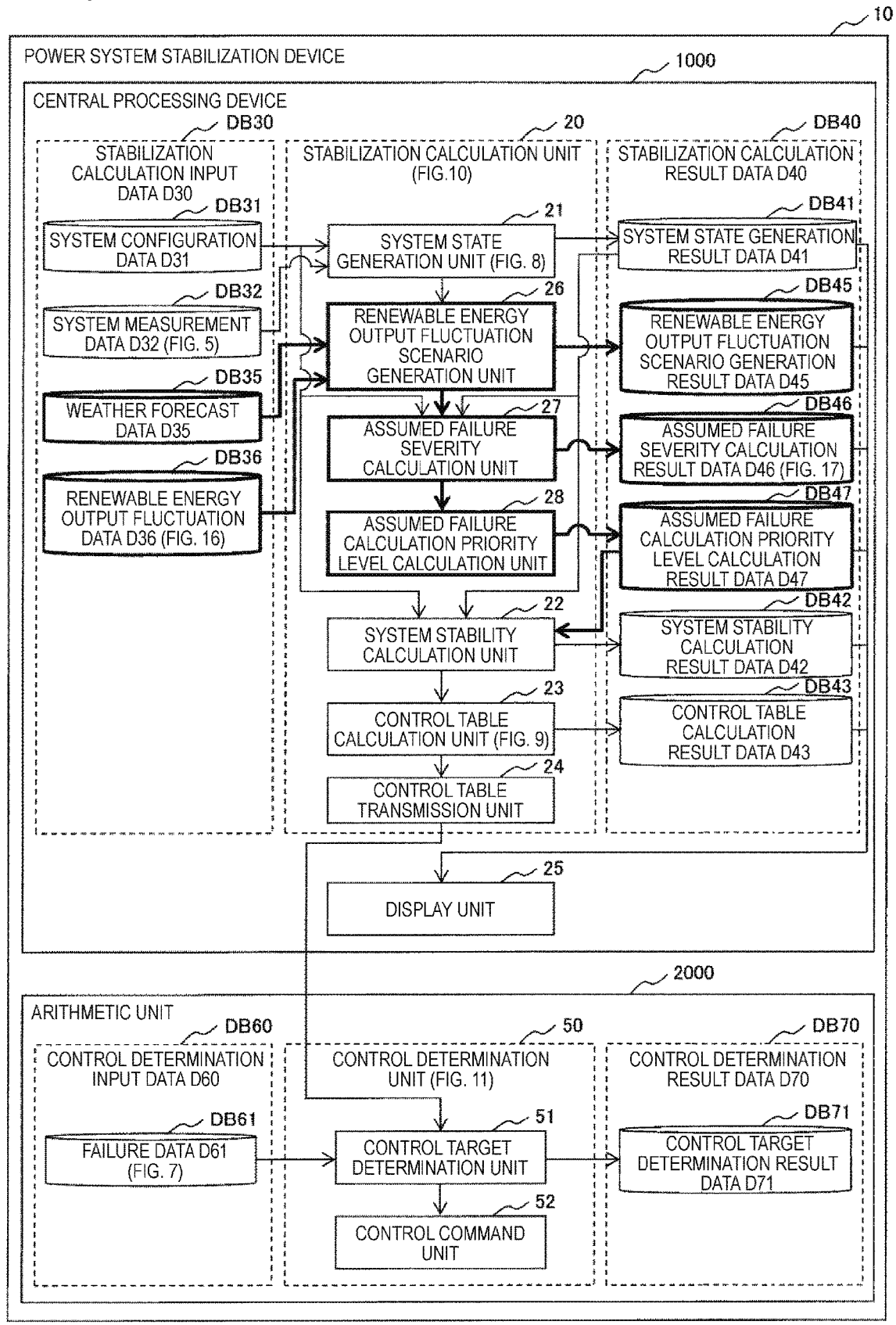

[FIG. 14]
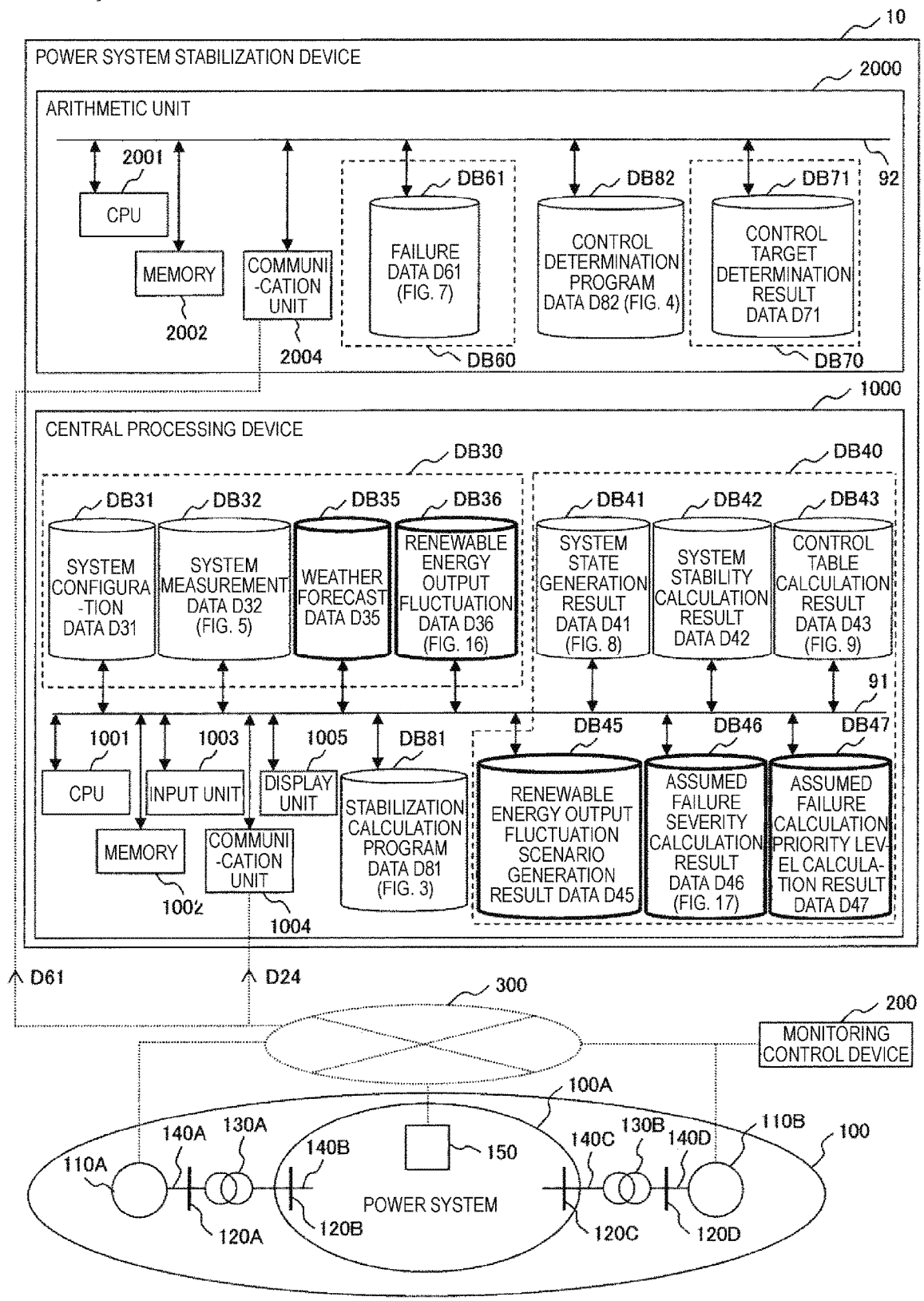

[FIG. 15]
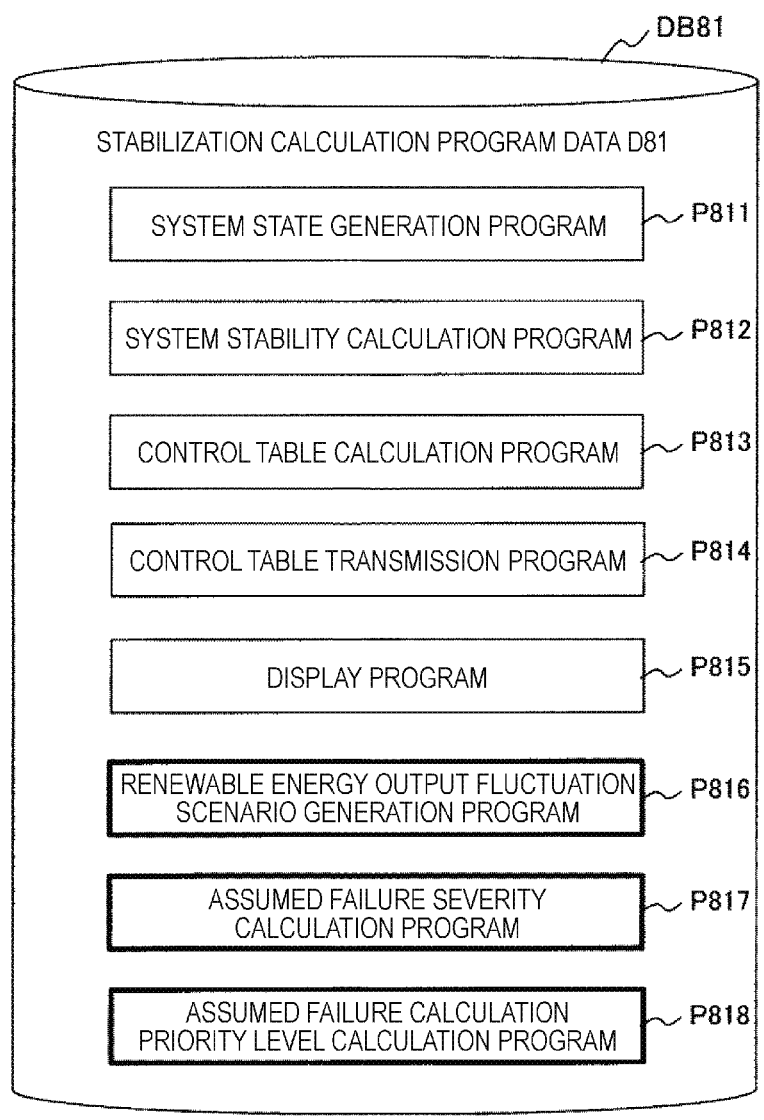

PHOTOVOLTAIC POWER GENERATION

| RENEWABLE ENERGY LOCATION (D361) | WEATHER TYPE (D362) | ACTIVE POWER FLUCTUATION AMOUNT (MW) (D363) | REACTIVE POWER FLUCTUATION AMOUNT (MVar) (D364) |
|---|---|---|---|
| R1 | SUNNY PARTLY CLOUDY | 5 | 0.5 |
| | SUNNY | 0 | 0 |
| | CLOUDY PARTLY SUNNY | 4 | 0.4 |
| | CLOUDY | 0 | 0 |
| | RAINY | 0 | 0 |
| R2 | SUNNY PARTLY CLOUDY | 10 | 1 |
| ⋮ | ⋮ | ⋮ | ⋮ |

WIND POWER GENERATION

| RENEWABLE ENERGY LOCATION (D365) | WIND SPEED (m/s) (D366) | ACTIVE POWER FLUCTUATION AMOUNT (MW) (D367) | REACTIVE POWER FLUCTUATION AMOUNT (MVar) (D368) |
|---|---|---|---|
| R3 | LESS THAN 25 | 0 | 0 |
| | EQUAL TO OR MORE THAN 25 | − PRESENT OUTPUT (OUTPUT 0) | − PRESENT OUTPUT (OUTPUT 0) |
| R4 | LESS THAN 25 | 0 | 0 |
| | EQUAL TO OR MORE THAN 25 | − PRESENT OUTPUT (OUTPUT 0) | − PRESENT OUTPUT (OUTPUT 0) |
| ⋮ | ⋮ | ⋮ | ⋮ |

[FIG. 17]

| FAILURE TYPE | | SEVERITY (MW) |
|---|---|---|
| FAILURE LOCATION | FAILURE MODE | |
| TRANSMISSION LINE A (TRANSMISSION END) | 3φ6LG(ABCA'B'C') | 700 |
| TRANSMISSION LINE B (RECEPTION END) | 3φ6LG(ABCA'B'C') | 600 |
| TRANSMISSION LINE D (TRANSMISSION END) | 3φ6LG(ABCA'B'C') | 550 |
| TRANSMISSION LINE A (TRANSMISSION END) | 3φ4LG(ABB'C') | 300 |
| TRANSMISSION LINE B (RECEPTION END) | 3φ4LG(ABB'C') | 250 |
| TRANSMISSION LINE D (TRANSMISSION END) | 3φ4LG(ABB'C') | 220 |
| TRANSMISSION LINE C (RECEPTION END) | 3φ6LG(ABCA'B'C') | 200 |
| TRANSMISSION LINE E (TRANSMISSION END) | 3φ6LG(ABCA'B'C') | 100 |
| ⋮ | ⋮ | ⋮ |

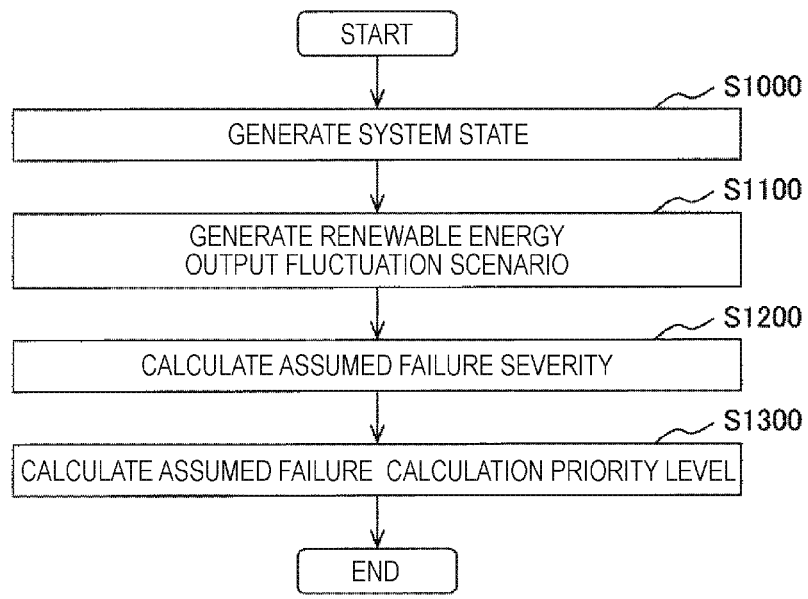

[FIG. 19]
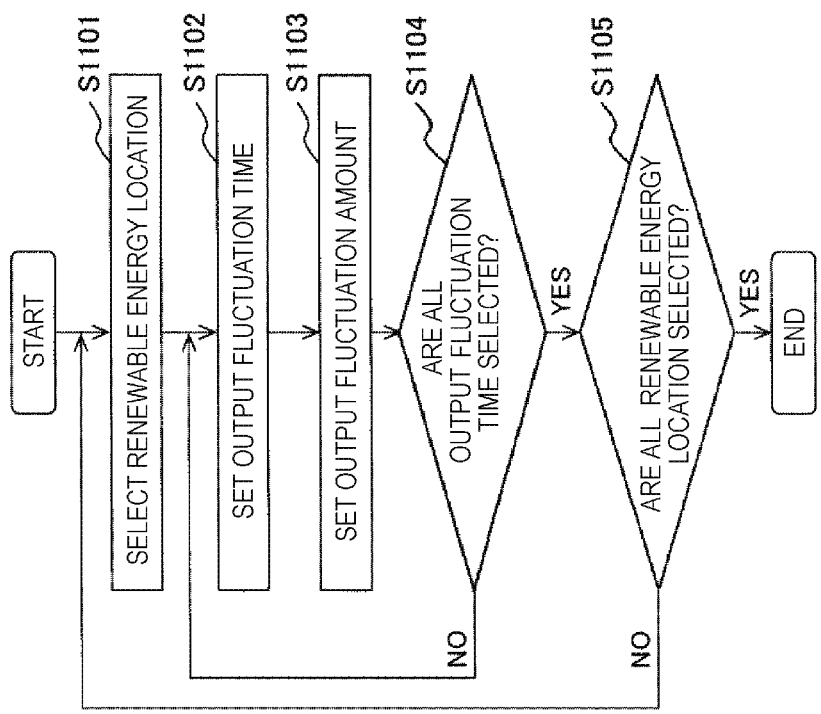

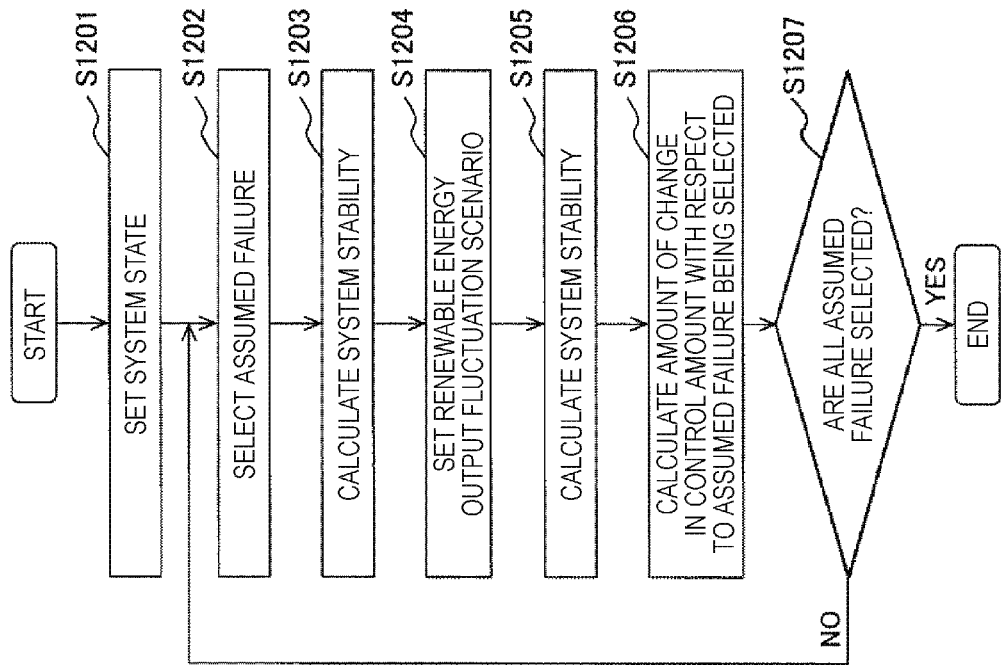
[FIG. 20]

[FIG. 21]
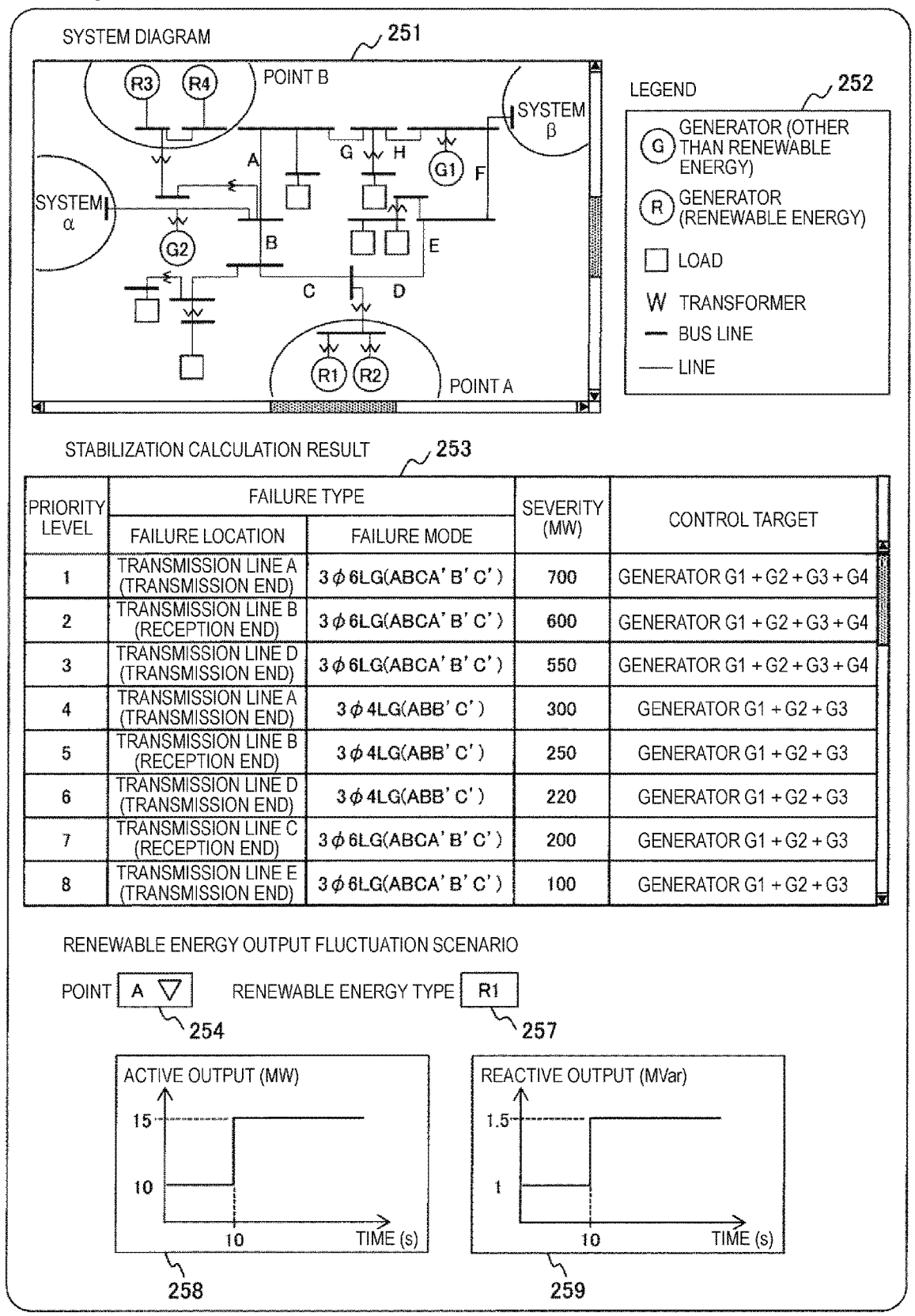

[FIG. 22]
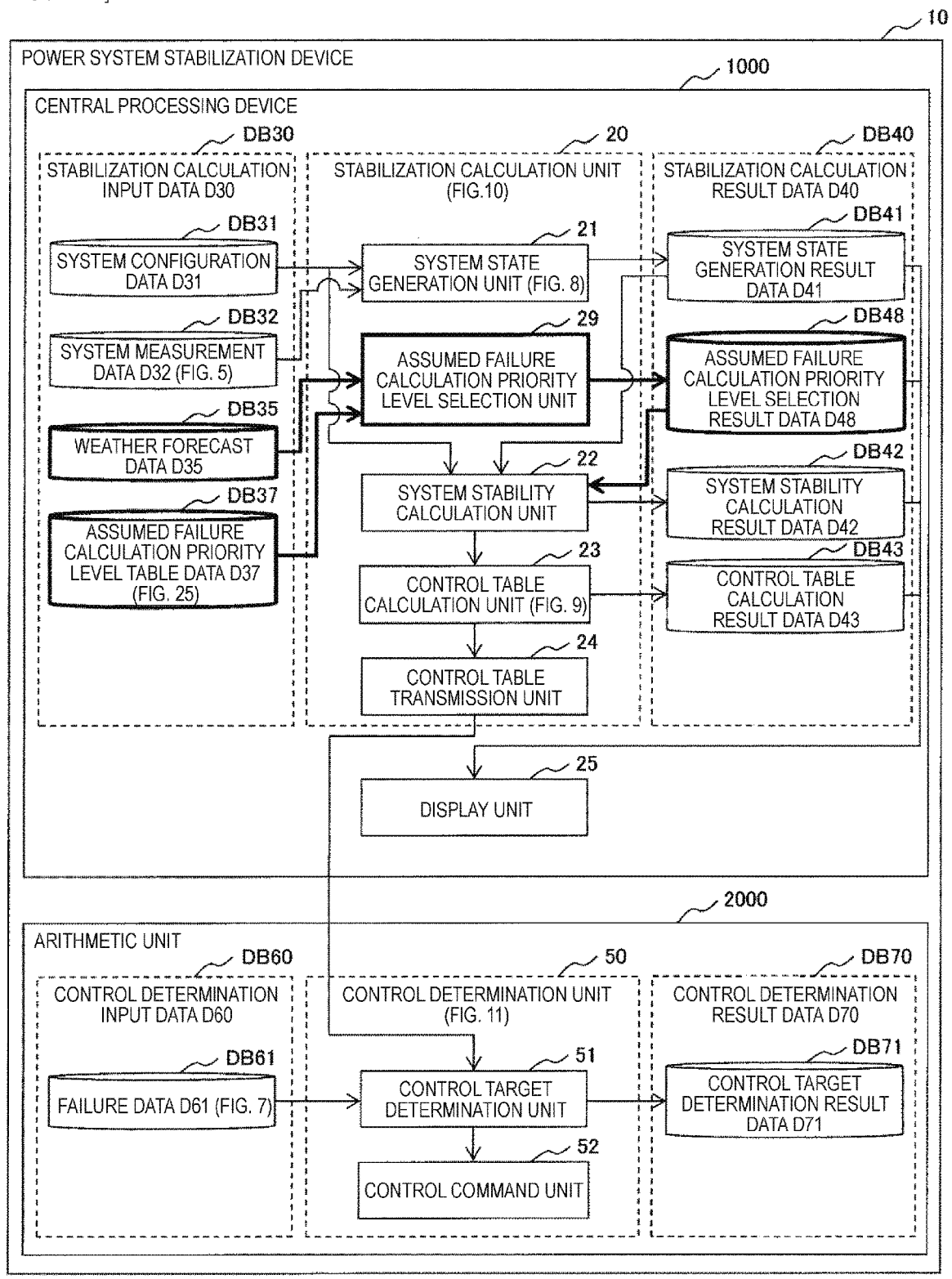

[FIG. 23]
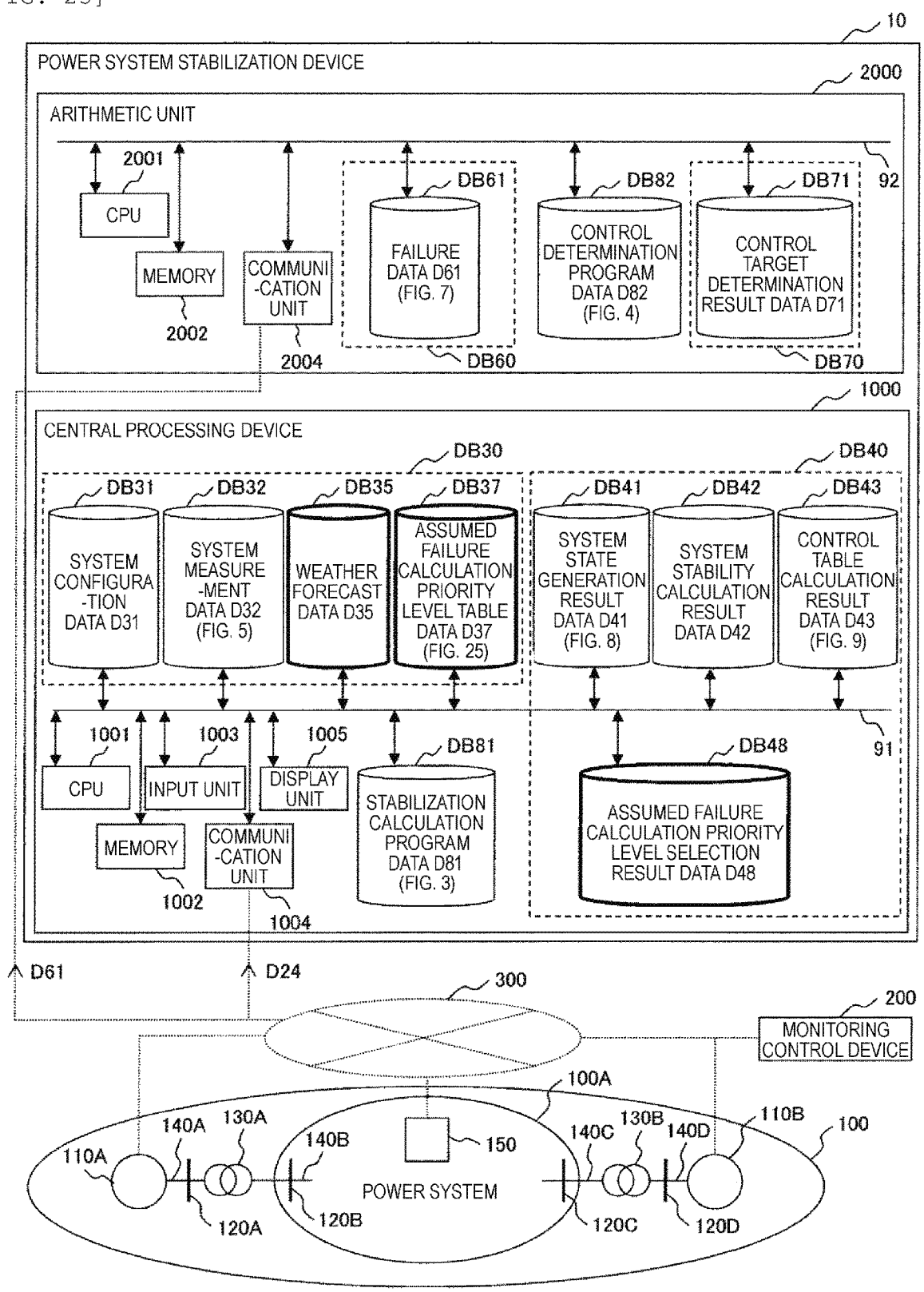

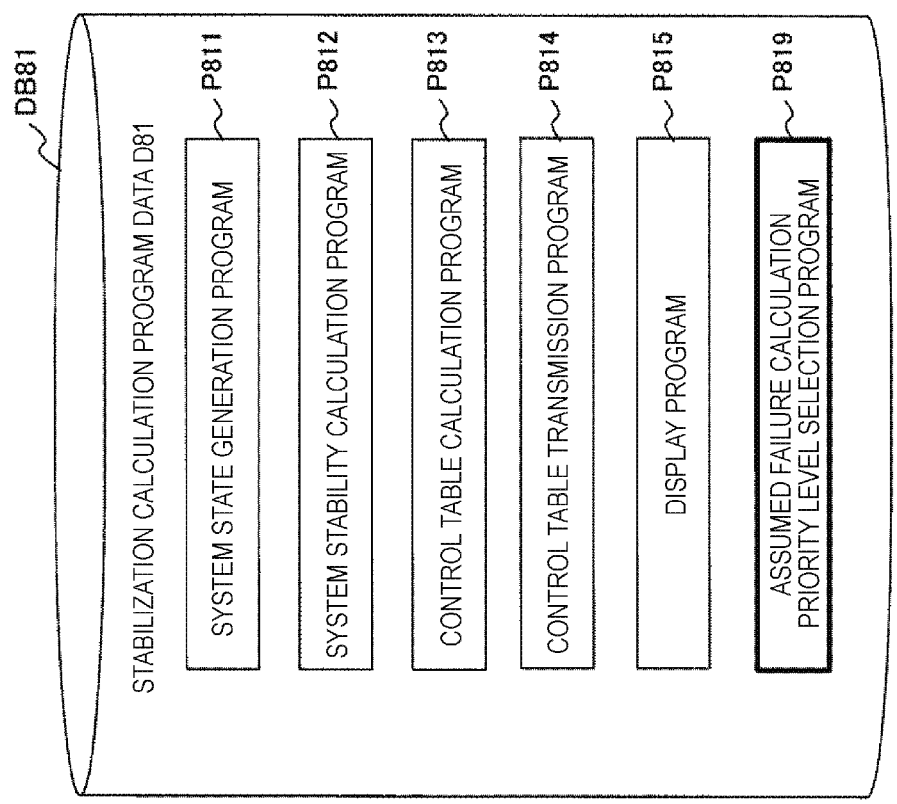
[FIG. 24]

RENEWABLE ENERGY OUTPUT FLUCTUATION SCENARIO B

D373 — RENEWABLE ENERGY OUTPUT FLUCTUATION SCENARIO A

| PRIORITY LEVEL | FAILURE TYPE | |
|---|---|---|
| | FAILURE LOCATION (D371) | FAILURE MODE (D372) |
| 1 | TRANSMISSION LINE A (TRANSMISSION END) | 3φ6LG(ABCA'B'C') |
| 2 | TRANSMISSION LINE B (RECEPTION END) | 3φ6LG(ABCA'B'C') |
| 3 | TRANSMISSION LINE D (TRANSMISSION END) | 3φ6LG(ABCA'B'C') |
| 4 | TRANSMISSION LINE A (TRANSMISSION END) | 3φ4LG(ABB'C') |
| 5 | TRANSMISSION LINE B (RECEPTION END) | 3φ4LG(ABB'C') |
| 6 | TRANSMISSION LINE D (TRANSMISSION END) | 3φ4LG(ABB'C') |
| 7 | TRANSMISSION LINE C (RECEPTION END) | 3φ6LG(ABCA'B'C') |
| 8 | TRANSMISSION LINE E (TRANSMISSION END) | 3φ6LG(ABCA'B'C') |
| ⋮ | ⋮ | ⋮ |

| RENEWABLE ENERGY OUTPUT FLUCTUATION SCENARIO TYPE (D374) | CONTENT | | | |
|---|---|---|---|---|
| | POINT A (D377) | | POINT B (D375) | |
| | WEATHER | WIND SPEED (m/s) (D378) | WEATHER | WIND SPEED (m/s) (D376) |
| A | SUNNY PARTLY CLOUDY | 0 | SUNNY PARTLY CLOUDY | 0 |
| B | SUNNY PARTLY CLOUDY | 10 | SUNNY PARTLY CLOUDY | 10 |
| C | SUNNY | 0 | SUNNY PARTLY CLOUDY | 0 |
| D | CLOUDY | 0 | SUNNY PARTLY CLOUDY | 10 |
| ⋮ | ⋮ | ⋮ | ⋮ | ⋮ |

[FIG. 26]
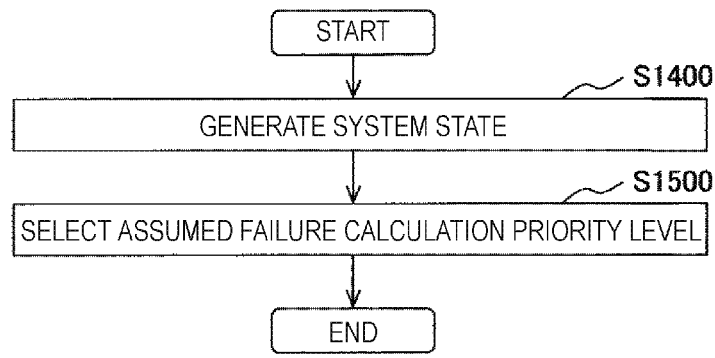
[FIG. 27]
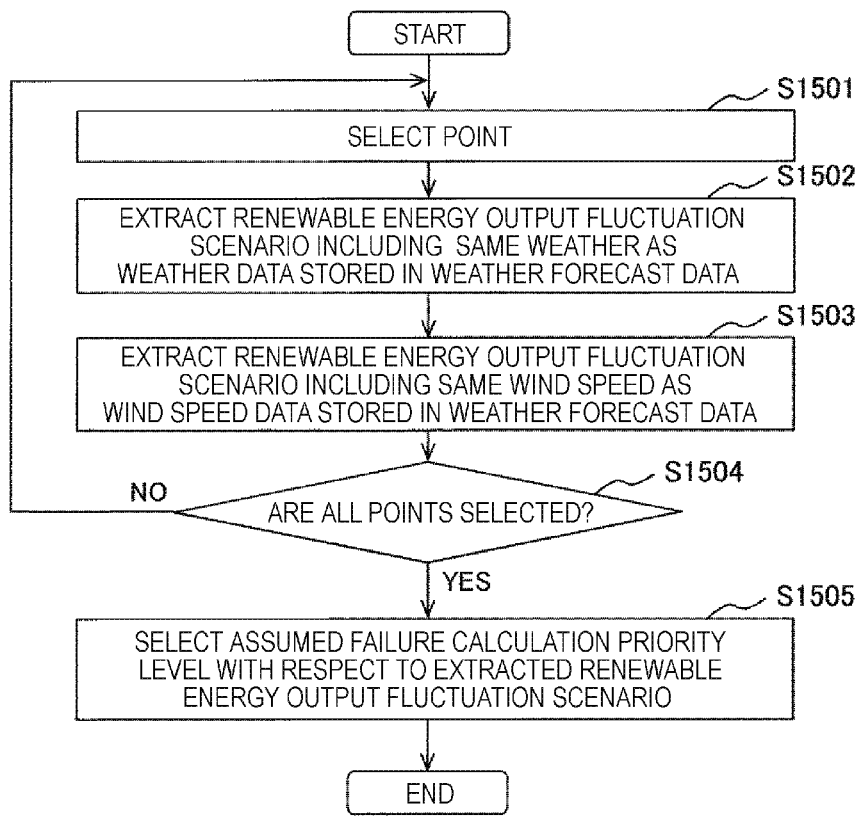

[FIG. 28]
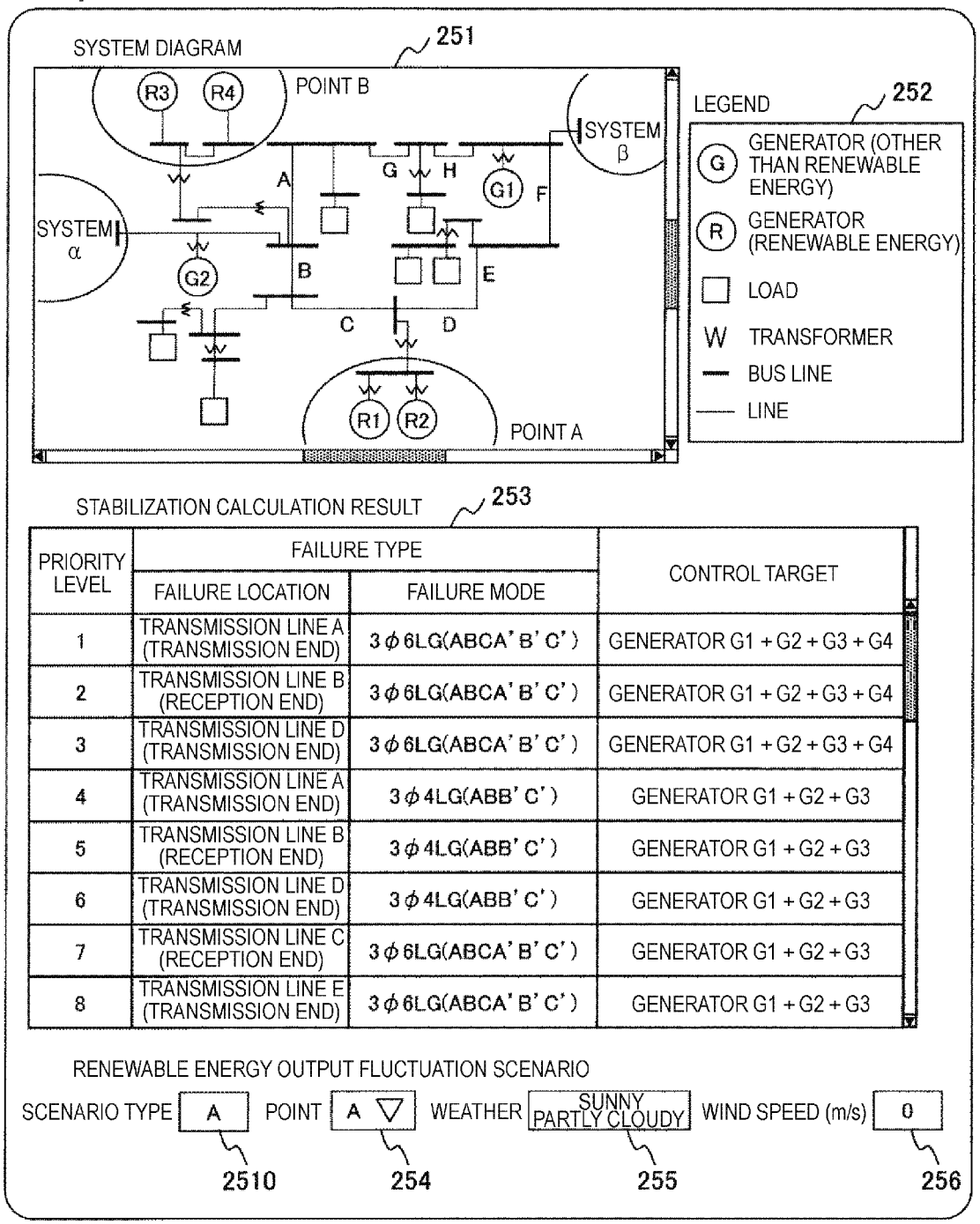

[FIG. 29]
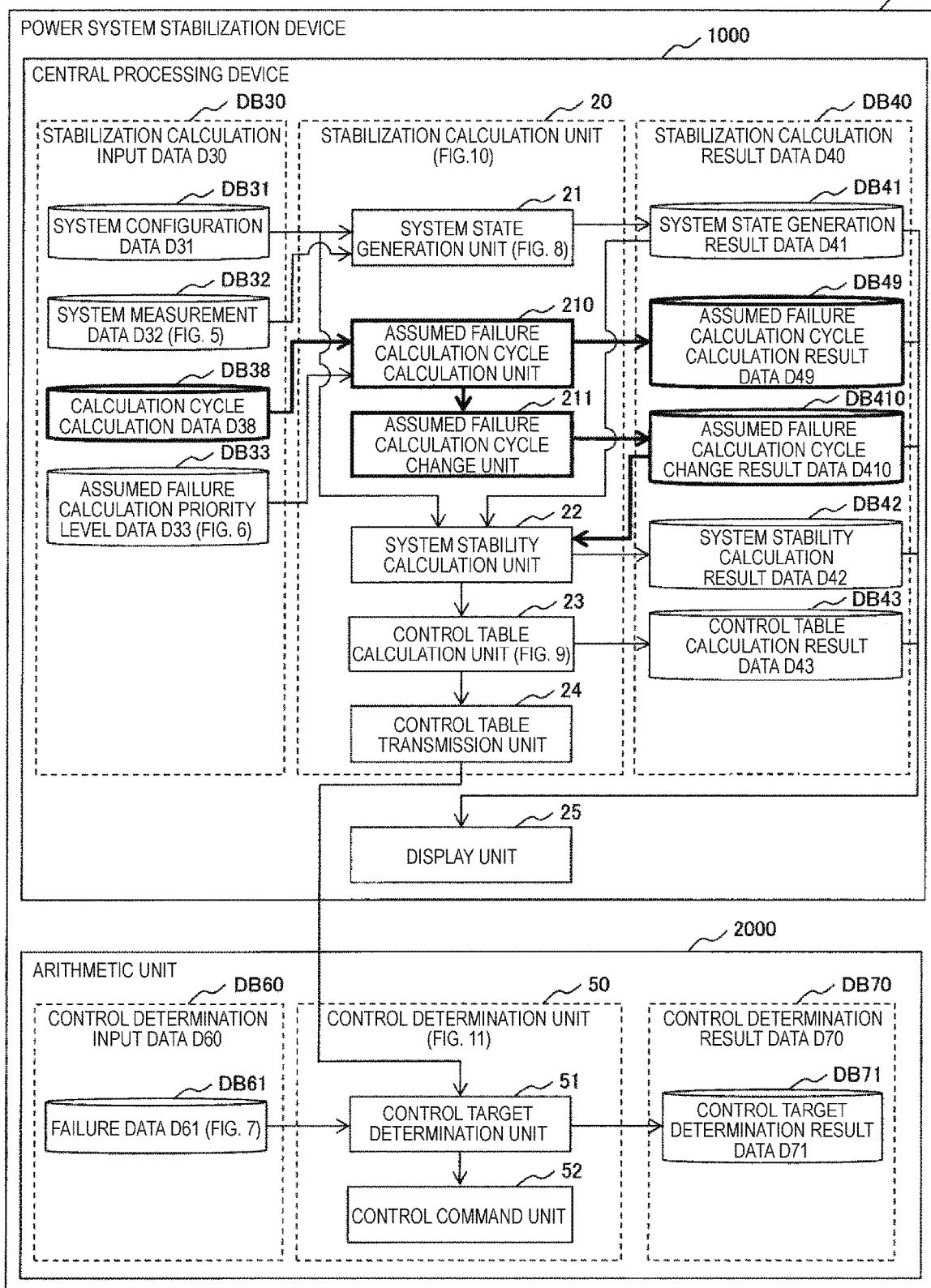

[FIG. 30]
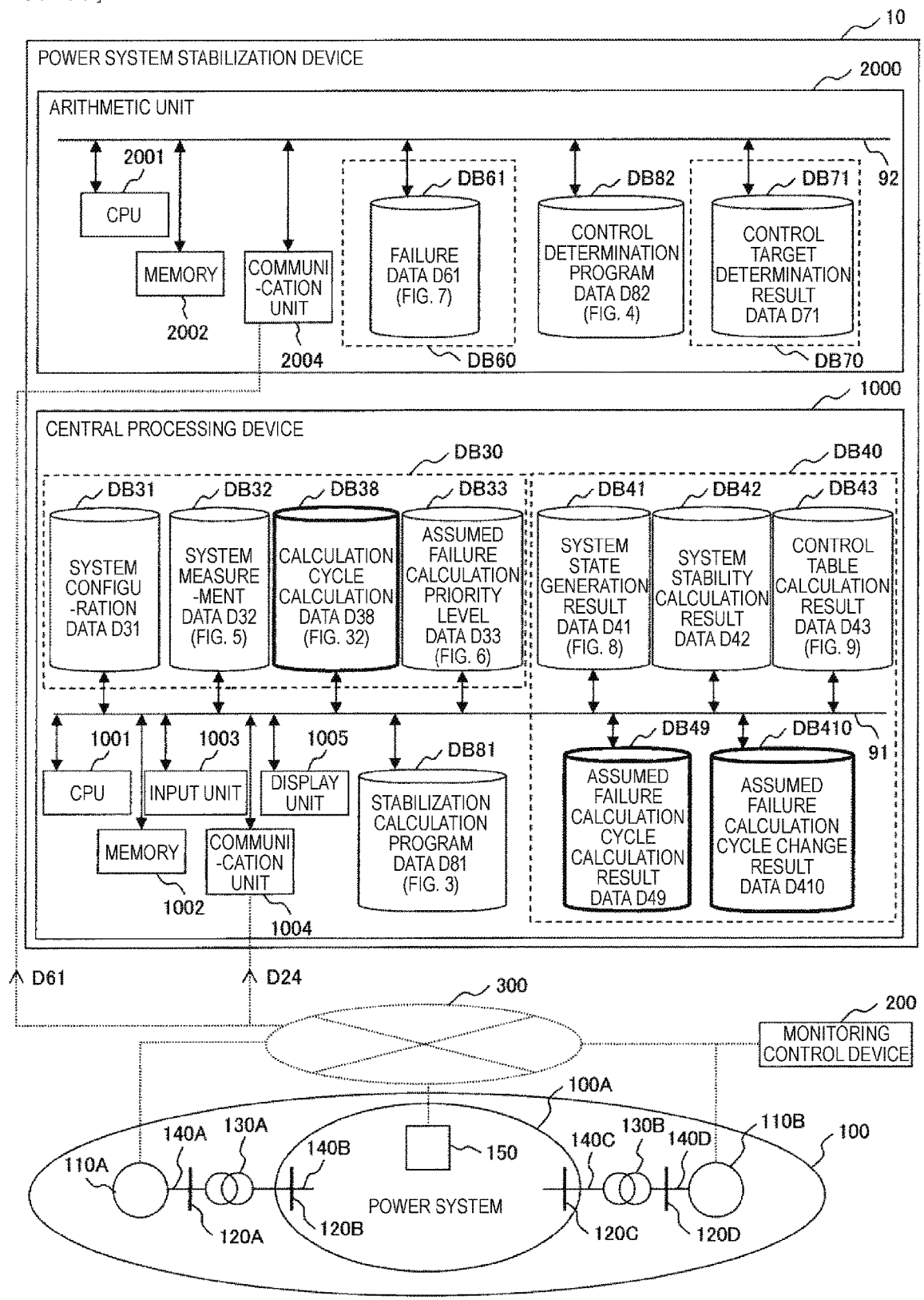

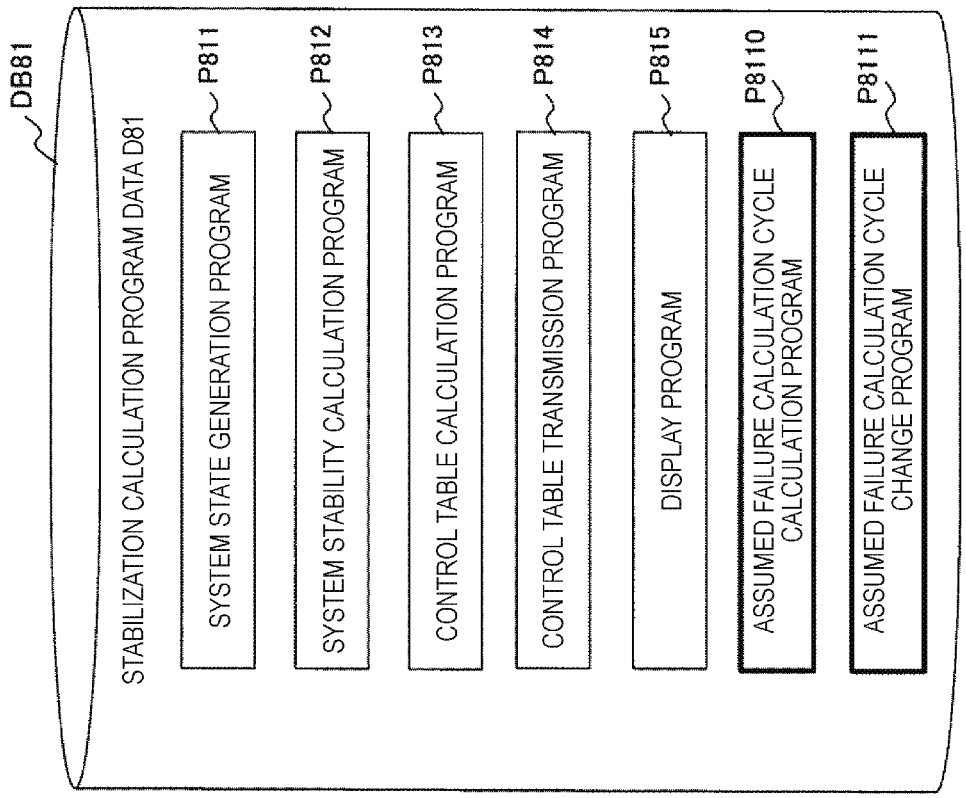
[FIG. 31]

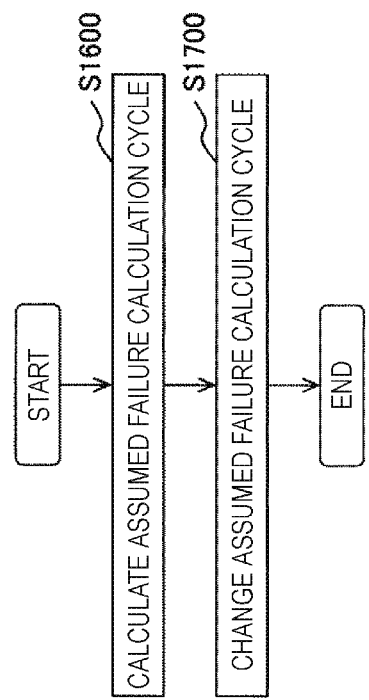
[FIG. 32]
[FIG. 33]

[FIG. 34]
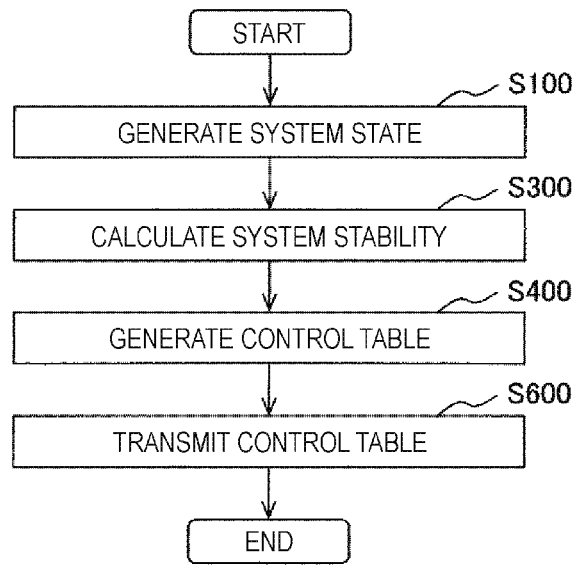
[FIG. 35]
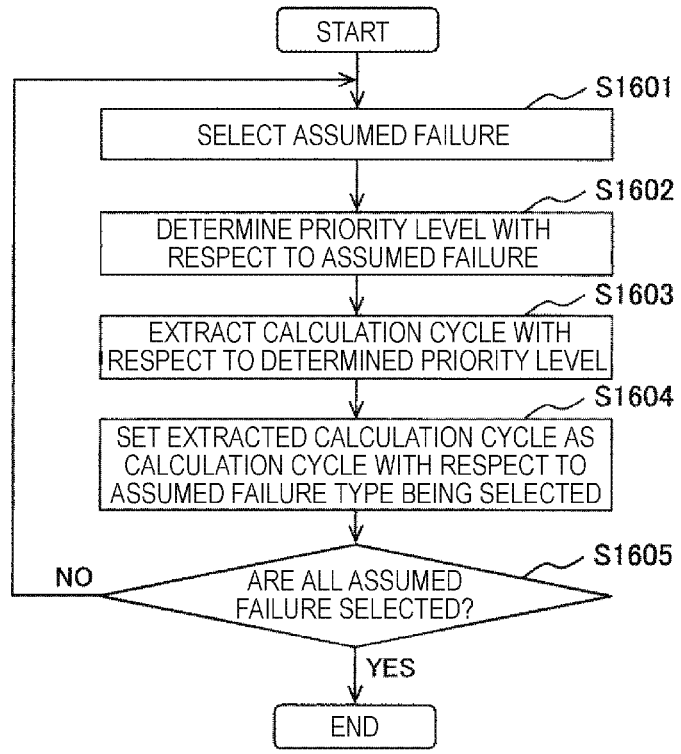

[FIG. 36]
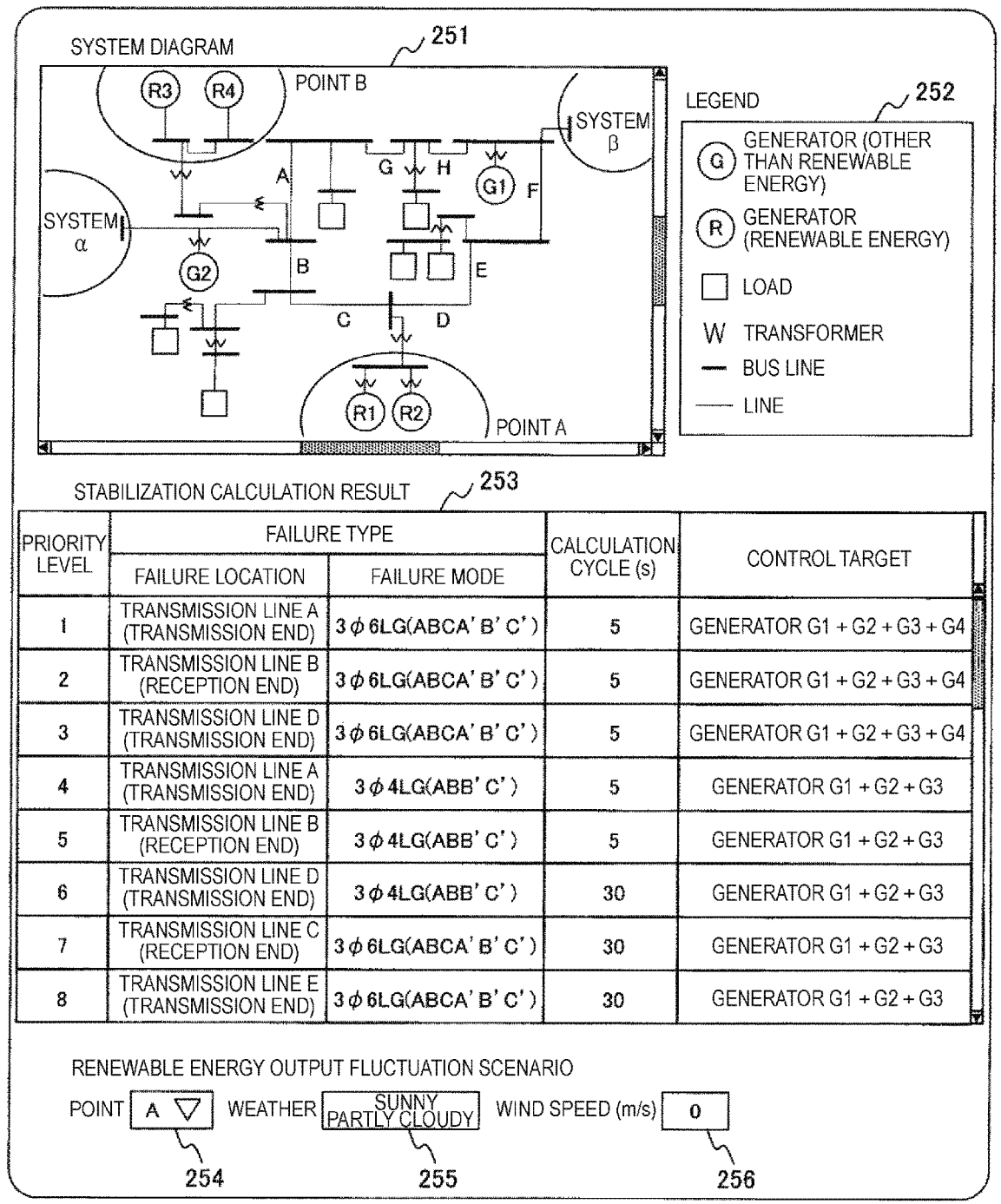

POWER SYSTEM STABILIZATION DEVICE AND POWER SYSTEM STABILIZATION METHOD

TECHNICAL FIELD

The present invention relates to a stabilization device and a stabilization method of a power system.

BACKGROUND ART

The stabilization system of the power system computes in advance (pre-computes) a control target (electric controller or load control target) using the system information before failure occurrence for each of assumed failures, and controls the control target determined in advance based on the failure information and the pre-computation result when the failure occurs.

Meanwhile, in the future, when a large amount of renewable energy (photovoltaic power generation and wind power generation) is introduced into the power system, uncertain and abrupt current fluctuations occur. On the other hand, in the on-line pre-computation type power system stabilization device, since the abrupt current fluctuation due to the renewable energy is not assumed, there is a possibility that appropriate control is not performed and an excess/shortage of control occurs due to a difference in the current states between the time of pre-computation and the time of control.

In order to address this problem, PTL 1 proposes an on-line pre-computation type power system stabilization device that enables appropriate control according to the state of the current power system by immediately reflecting the setting results of the electric controller in the control.

Specifically, in PTL 1, disclosed is "a power system stabilization system that is an on-line pre-computation type power system, the system including a central processing device that generates a system model for analysis based on current connection status and demand/supply status of the power system and system facility data stored in advance, determine the stability of the power system for each analysis condition of a plurality of assumed fault data, and sets, as a control table, an electric controller (generator for limiting power supply) necessary for maintaining the stability of the power system when each assumed fault occurs, a fault detection terminal device that determines and detects the type of a fault based on the occurrence of the fault in the power system as a start condition, an arithmetic unit that determines an electric controller by collating the detected fault type with the control table, and a control terminal device that disconnects the electric controller determined by the arithmetic unit from the power system, in which, when there is an assumed fault which is completed with stability determination, electric controller selection, and electric controller setting in the control table, the central processing device transmits the electric controller setting result or the control table indicating the result to the arithmetic unit without waiting for the completion of the other assumed faults."

CITATION LIST

Patent Literature

PTL 1: JP-A-2013-59217

SUMMARY OF INVENTION

Technical Problem

However, in PTL 1, in order to compute a control target for each of the assumed failures with a fixed cycle, it takes time as much as a computation cycle until the set control target is updated. When a current fluctuation occurs within the update cycle, with respect to assumed failures where the amount of control required for stabilization changes significantly due to the current changes, there is a problem that appropriate control is not performed and an excess/shortage of control occurs, with respect to the set control target.

From the problem, in the present invention, there is provided a power system stabilization device and power system stabilization method in which an excess/shortage of control is prevented and an appropriate control suitable for the system state is enabled, even for assumed failures for which the control amount necessary for stabilization varies significantly with the current variations.

Solution to Problem

In order to solve the above problems, for example, the configuration described in the claims is adopted. The present application includes a plurality of means for solving the above-mentioned problems, and for example, provided is "a power system stabilization device including a central processing device in which there is determined, in advance, a control target device necessary to maintain stability when an assumed failure in a power system including renewable energy occurs, in which the central processing device executes, for each of a plurality of assumed failures, a computation for determining a control target necessary to maintain stability at the time of the assumed failure, and determines, according to an output fluctuation scenario for renewable energy pertaining to the weather, the degree of priority of executing a computation for determining a control target necessary to maintain stability at the time of each of the assumed failures."

The present invention relates to "a power system stabilizer including a central processing device that determines the stability of the power system and calculates, as a control table, the control target (stabilization control target) necessary to maintain the stability of the power system when each of the assumed failures occurs and an arithmetic unit that determines the control target by collating a failure type generated in the power system with the control table, in which the central processing device includes a system state generation unit that generates a system state using the system configuration data and the system measurement data, a system stability calculation unit that calculates the stability of the power system using priority level of stability calculations for each of the assumed failures with respect to generation result of the system state, system configuration data, and output fluctuation scenario for renewable energy to calculate a stabilization control target, a control table calculation unit that calculates a control table using the calculation result of the system stability, and a control table transmission unit that transmits the control table to the arithmetic unit."

The present invention relates to "a power system stabilization method in which there is determined, in advance, a control target device necessary to maintain stability when an assumed failure in a power system including renewable energy occurs, in which the method includes executing, for each of a plurality of assumed failures, a computation for determining a control target necessary to maintain stability at the time of the assumed failure, and determining, according to an output fluctuation scenario for renewable energy pertaining to the weather, the degree of priority of executing a computation for determining a control target necessary to maintain stability at the time of each of the assumed failures."

The present invention relates to "a power system stabilization method in which there is determined, in advance, a control target device necessary to maintain stability when an assumed failure in a power system including renewable energy occurs, the method including generating a system state using the system configuration data and the system measurement data, calculating the stability of the power system using priority level of stability calculations for each of the assumed failures with respect to generation result of the system state, system configuration data, and output fluctuation scenario for renewable energy, calculating the control table which is the relationship between each of the assumed failures and the control target using the calculation result of the system stability, and determining a stabilization control target using failure data and a control table."

Advantageous Effects of Invention

According to the present invention, excess/shortage of control can be prevented, and an appropriate control suitable for the system state can be enabled.

BRIEF DESCRIPTION OF DRAWINGS

FIG. 1 is a diagram illustrating an example of an overall configuration of a power system stabilization device 10 according to a first embodiment.

FIG. 2 is a diagram illustrating an example of an overall configuration of a power system stabilization system when the power system stabilization device of FIG. 1 is applied to a power system.

FIG. 3 is a diagram illustrating an example of a configuration of a power system stabilization device, illustrating contents of stabilization calculation program data.

FIG. 4 is a diagram illustrating an example of a configuration of a power system stabilization device, illustrating contents of control determination program data.

FIG. 5 is a diagram illustrating an example of system measurement data D32 stored in a system measurement database DB32.

FIG. 6 is a diagram illustrating an example of assumed failure calculation priority level data D33 stored in an assumed failure calculation priority level database DB33.

FIG. 7 is a diagram illustrating an example of failure data D61 stored in a failure database DB61.

FIG. 8 is a diagram illustrating an example of system state generation result data D41 stored in a system state generation result database DB41.

FIG. 9 is a diagram illustrating an example of control table generation result data D43 stored in a control table generation result database DB43.

FIG. 10 is a flowchart illustrating an example of processing content of a central processing device in the power system stabilization device according to the first embodiment.

FIG. 11 is a flowchart illustrating an example of processing content of an arithmetic unit in the power system stabilization device according to the first embodiment.

FIG. 12 is a diagram illustrating an example of a screen display of the power system stabilization device according to the first embodiment.

FIG. 13 is a diagram illustrating an example of an overall configuration of a power system stabilization device 10 according to a second embodiment.

FIG. 14 is a diagram illustrating an example of an overall configuration of a power system stabilization system when the power system stabilization device of FIG. 13 is applied to a power system.

FIG. 15 is a diagram illustrating an example of a configuration illustrating contents of stabilization calculation program data of the power system stabilization device according to the second embodiment.

FIG. 16 is a diagram illustrating an example of renewable energy output fluctuation data D36 stored in a renewable energy output fluctuation database DB36.

FIG. 17 is a diagram illustrating an example of assumed failure severity calculation result data D46 stored in an assumed failure severity calculation result database DB46.

FIG. 18 is a flowchart illustrating an example of processing content for assumed failure calculation priority level calculation of the central processing device in the power system stabilization device according to the second embodiment.

FIG. 19 is a detailed flowchart of processing step S1100 in FIG. 18.

FIG. 20 is a detailed flowchart of processing step S1200 in FIG. 19.

FIG. 21 is a diagram illustrating an example of a screen display of the power system stabilization device according to the second embodiment.

FIG. 22 is a diagram illustrating an example of an overall configuration of a power system stabilization device 10 according to a third embodiment.

FIG. 23 is a diagram illustrating an example of an overall configuration of a power system stabilization system when the power system stabilization device of FIG. 22 is applied to a power system.

FIG. 24 is a diagram illustrating an example of a configuration illustrating contents of stabilization calculation program data of the power system stabilization device according to the third embodiment.

FIG. 25 is a diagram illustrating an example of assumed failure calculation priority level table data D37 stored in an assumed failure calculation priority level table database DB37.

FIG. 26 is a flowchart illustrating an example of processing content for assumed failure calculation priority level selection of the central processing device in the power system stabilization device according to the third embodiment.

FIG. 27 is a detailed flowchart of processing step S1500 in FIG. 26.

FIG. 28 is a diagram illustrating an example of a screen display of the power system stabilization device according to the third embodiment.

FIG. 29 is a diagram illustrating an example of an overall configuration of a power system stabilization device 10 according to a fourth embodiment.

FIG. 30 is a diagram illustrating an example of an overall configuration of a power system stabilization system when the power system stabilization device of FIG. 29 is applied to a power system.

FIG. 31 is a diagram illustrating an example of a configuration illustrating contents of stabilization calculation program data of the power system stabilization device according to the fourth embodiment.

FIG. 32 is a diagram illustrating an example of calculation cycle data D38 stored in a calculation cycle database DB38.

FIG. 33 is a flowchart illustrating an example of processing content for assumed failure calculation cycle calculation of the central processing device in the power system stabilization device according to the fourth embodiment.

FIG. 34 is a flowchart illustrating an example of processing content for control table calculation of the central processing device in the power system stabilization device according to the fourth embodiment.

FIG. 35 is a detailed flowchart of processing step S1600 in FIG. 33.

FIG. 36 is a diagram illustrating an example of a screen display of the power system stabilization device according to the fourth embodiment.

DESCRIPTION OF EMBODIMENTS

Hereinafter, embodiments of the present invention will be described with reference to the drawings.

First Embodiment

FIG. 1 is a diagram illustrating an overall configuration of a power system stabilization device 10 according to a first embodiment. FIG. 1 illustrates the power system stabilization device 10 from the viewpoint of its functional configuration.

The power system stabilization device 10 is configured of a central processing device 1000 and an arithmetic unit 2000. The central processing device 1000 includes a stabilization calculation input database DB30, a stabilization calculation unit 20, a stabilization calculation result database DB40, and a display unit 25. The arithmetic unit 2000 is configured of a control determination input database DB60, a control determination unit 50, and a control determination result database DB70.

The stabilization calculation input database DB30 includes a plurality of databases DB31 to DB33.

Among the plurality of databases DB31 to DB33, the system configuration database DB31 stores system configuration data D31. The system measurement database DB32 stores system measurement data D32 illustrated in FIG. 5. The assumed failure calculation priority level database DB33 stores the assumed failure calculation priority level data D33 illustrated in FIG. 6. Detailed examples of the memory contents will be described below.

The stabilization calculation unit 20 is a function for performing stabilization calculation of the power system at the time of occurrence of an assumed failure, and a series of processing contents are illustrated in the flowchart of FIG. 10. The processing functions of the stabilization calculation unit 20 are the following processing function units (21 to 24).

Among the processing function units 21 to 24, the system state generation unit 21 is a function for generating a system state. The system stability calculation unit 22 is a function for calculating system stability and calculating a control target (stabilization control target) necessary to maintain the stability. The control table calculation unit 23 is a function for generating a control table. The control table transmission unit 24 is a function for transmitting the control table to the arithmetic unit.

The stabilization calculation result database DB40 includes a plurality of databases DB41 to DB43. In summary, the plurality of databases DB41 to DB43 respectively accumulate and store processing results of the processing function units (21 to 23).

Among the plurality of databases DB41 to DB43, the system state generation result database DB41 stores the system state generation result data D41 generated by the system state generation unit 21 illustrated in FIG. 8. The system stability calculation result database DB42 stores system stability calculation result data D42 calculated by the system stability calculation unit 22. The control table generation result database DB43 stores control table calculation result data D43 generated by the control table calculation unit 23 illustrated in FIG. 9. Note that the data stored in the stabilization calculation result database DB40 are stored not only as data as calculation results but also as data of results at intermediate processing time point, and may be useful in appropriate situations. Detailed examples of the memory contents will be described below.

On the display unit 25, various data handled by the central processing device 1000 are appropriately processed and displayed in an easy to see format. Input means such as a mouse and a keyboard is included such that the function of the display unit 25 reflects an appropriate input result on the display screen.

Regarding the arithmetic unit 2000, first, the control determination input database DB60 is configured of a database DB61.

The failure database DB61 stores the failure data D61 illustrated in FIG. 7. Detailed example of the memory content will be described below.

The control determination unit 50 is a function for determining the stabilization control target of the power system when a failure actually occurs, and a series of processing contents are illustrated in the flowchart of FIG. 11. The function for processing in the control determination unit is the following processing function units (51 and 52).

Among the processing function units 51 and 52, the control target determination unit 51 is a function for determining the stabilization control target of the power system when a failure actually occurs. The control command unit 52 is a function for issuing control commands.

The control determination result database D70 includes a database DB71. The database DB71 accumulates and stores processing results of the processing function unit 51.

The control target determination result database DB71 stores control target determination result data D71 determined by the control target determination unit 51. Note that the data stored in the control determination database DB70 is stored not only as data as the determination result but also as data of the result at the intermediate processing time point, and may be useful in an appropriate situation.

As described above, the input data of the central processing device 1000 is held and stored in the stabilization calculation input database DB30, which are the system configuration data D31, the system measurement data D32, the assumed failure calculation priority level data D33, and the like. Input data of the arithmetic unit 2000 is held and stored in the control determination input database DB60, which is the failure data D61 and the like.

The system state generation unit 21 of the central processing device 1000 generates a system state using the system configuration data D31 and the system measurement data D32, and outputs system state generation result data D41.

The system stability calculation unit 22 of the central processing device 1000 calculates the system stability using the system configuration data D31, the system state generation result data D41, and the assumed failure calculation priority level data D33 to calculate the stabilization control target, and outputs the system stability calculation result data D42.

The control table calculation unit 23 of the central processing device 1000 outputs control table calculation result data D43 using the system stability calculation result data D42.

The control table transmission unit 24 of the central processing device 1000 transmits the control table using the control table calculation result data D43.

The display unit 25 of the central processing device 1000 displays information of each calculation result using the stabilization calculation result data D40 and the like.

The control target determination unit 51 of the arithmetic unit 2000 determines the control target using the failure data D61 and the control table calculation result data D43, and outputs the control target determination result data D71.

The control command unit 52 of the arithmetic unit 2000 performs control command using the control target determination result data D71.

FIG. 2 is a diagram illustrating an example of the overall configuration of a power system stabilization system when the power system stabilization device of FIG. 1 is applied to a power system. The configuration of the power system stabilization device 10 in FIG. 2 is described in terms of hardware configuration.

In FIG. 2, by the power system 100 applied with the power system stabilization device 10, it means a power transmission system 100A in a narrow sense, and has a concept including a power generation system in a broad sense. The drawing illustrates an example of the power system 100 including a generator 110 (110A and 110B), a bus line 120 (nodes: 120A, 120B, 120C, and 120D), a transformer 130 (130A and 130B), a transmission line 140 (branches: 140A, 140B, 140C, and 140D), and the like, but in addition, the power system 100 may include one or more of any of loads or other controllable devices (such as a battery, a secondary battery capable of being rechargeable and discharged, a battery for EV, a fly-wheel, a phase adjustment facility, and the like).

The facilities and devices described above that configure the power system are monitored and controlled from the viewpoint of ensuring the stability of the power system, and appropriately controlled and protected by control signals from a monitoring control device 200, for example. Meanwhile, from a variety of measuring apparatuses 150 installed in various places of the power system for monitoring control, the measurement signals D32 and D61, such as the current, voltage and other state signals of various places are gathered in the monitoring control device 200 directly or indirectly through a communication network 300. Likewise, the measurement signals are gathered from various measuring apparatuses 150 in the power system stabilization device 10. In the present example, the generator 110 includes distributed power sources such as photovoltaic power generation and wind power generation in addition to large power sources such as a thermal power generator, a hydroelectric power generator, and a nuclear power generator.

In the present example, the measuring apparatus 150 may be an apparatus (for example, instrument transformer (VT: voltage transformer, PT: potential transformer), instrument current transformer (CT: current transformer), bus line protection relay (BP: bus protection), transmission line protection relay (LP: line protection), transformer protection relay (TP: transformer protection)) for measuring one or more of any of a node voltage V, a branch current I, a power factor φ, an active power P, a reactive power Q, and a failure mode, and has a function (for example, telemeter (TM: telemeter)) for transmitting data including a data measuring location identification ID and an internal timing standard of the measuring apparatus. Note that the apparatus may measure power information with absolute time (phasor information of voltage) using GPS, a phase measurement unit (PMU), or another measuring device. Although it is described that the measuring apparatus 150 is installed on the power system 100A in a narrow sense, the measuring apparatus 150 may be installed on a bus line, a line, and the like connected to the generator 110, the transformer 130, the measuring apparatus 150, and the load.

The measurement signal D32 is each data (system measurement data) measured by the measuring apparatus 150, and is received by the system measurement database DB32 through the communication network 300. The measurement signal D61 is each data (failure data) measured by the measuring apparatus 150, and is received by the failure database DB61 through the communication network 300. However, instead of the system data from being directly received from the measuring apparatus 150, the measurement signal D32 and the measurement signal D61 may be collected at the monitoring control device 200, and then received by the system measurement database DB32 and the failure database DB61 through the communication network 300, respectively, and may be received by the system measurement database DB32 and the failure database D61 from both the measuring apparatus 150 and the monitoring control device 200 through the communication network 300. Note that the system measurement data D32 and the failure data D61 may include a unique number for identifying data and a time stamp. The system measurement data D32 is written as measured data, but may be stored in the system database in advance.

The hardware configuration of power system stabilization device 10 illustrated in FIG. 2 will be described.

In the central processing device 1000, a display unit 1005, an input unit 1003 such as a keyboard or a mouse, a communication unit 1004, a computer or computer server (CPU: central processing unit) 1001, a memory 1002, a stabilization calculation input database DB30 (a system configuration database DB31, a system measurement database DB32, and an assumed failure calculation priority level database DB33), a stabilization calculation result database DB40 (a system state generation result database DB41, a system stability calculation result database DB42, and a control table calculation result database DB43), and a stabilization calculation program database DB81 are connected to a bus line 91.

Among the units, the display unit 1005 is configured as a display device, for example. The display unit 1005 may be configured to use a printer device or a sound output device in place of or in conjunction with the display device, for example.

The input unit 1003 may be configured to include at least one of a keyboard switch, a pointing device such as a mouse, a touch panel, a voice instruction device, and the like, for example.

The communication unit 1004 includes a circuit and a communication protocol for connecting to the communication network 300.

The CPU 1001 reads a predetermined computer program from the stabilization calculation program database DB81 and executes the same. The CPU 1001 may be configured as one or more semiconductor chips, or may be configured as a computer device such as a calculation server.

The memory 1002 is configured as a random access memory (RAM), and stores a computer program read from the stabilization calculation program database 81, and stores calculation result data, image data, and the like necessary for each processing, for example. The screen data stored in the memory 1002 is sent to the display unit 1005 and displayed. An example of the displayed screen will be described below.

In the arithmetic unit 2000, a communication unit 2004, a computer or computer server (CPU: central processing unit) 2001, a memory 2002, a control determination input database DB60 (a failure database DB61), a control determination result database DB70 (a control target determination result database DB71), a control determination program database DB82 are connected to the bus line 92.

The communication unit 2004 includes a circuit and a communication protocol for connecting to the communication network 300.

The CPU 2001 reads and executes a predetermined computer program from the control determination program database DB82. The CPU 2001 may be configured as one or more semiconductor chips, or may be configured as a computer device such as a calculation server.

The memory 2002 is configured as a random access memory (RAM), and stores a computer program read from the control determination program database 82, and stores calculation result data, image data, and the like necessary for each processing, for example.

Here, referring to FIG. 3, the storage contents of the stabilization calculation program database DB81 will be described. FIG. 3 is a diagram illustrating an example of a configuration of the central processing device 1000, illustrating the contents of program data. The stabilization calculation program database DB81 stores a system state generation program P811, a system stability calculation program P812, a control table calculation program P813, a control table transmission program P814, and a display program P815, for example.

Returning to FIG. 2, the CPU 1001 executes the arithmetic program (system state generation program P811, system stability calculation program P812, control table calculation program P813, control table transmission program P814, and display program P815) read from the stabilization calculation program database DB81 to the memory 1002, and performs generation of a system state, calculation of system stability, calculation of a control table, transmission of a control table, instruction for image data to be displayed, and search of data in various databases, and the like.

The memory 1002 is a memory for temporarily storing calculation temporary data and calculation result data such as image data for display, system state generation result data, system stability calculation result data, control table calculation result data, and the like, and, by the CPU 1001, generates necessary image data and displays the data on the display unit 1005 (for example, a display screen). Note that the display unit 1005 of the central processing device 1000 may have only a simple screen for rewriting each control program or database.

Here, the storage contents of the control determination program database DB82 will be described with reference to FIG. 4. FIG. 4 is a diagram illustrating a configuration example illustrating the contents of program data of the arithmetic unit 2000. The control determination program database DB82 stores a control target determination program P821 and a control command program P822, for example.

Returning to FIG. 2, the CPU 2001 executes the computation program (control target determination program P821 and control command program P822) read from the control determination program database DB82 to the memory 2002, and performs control target determination, control instructions, search of data in various databases, and the like.

The memory 2002 is a memory for temporarily storing calculation temporary data such as the control target determination result data and the calculation result data.

The power system stabilization device 10 stores largely 10 databases DBs. Hereinafter, a stabilization calculation input database DB30 (a system configuration database DB31, a system measurement database DB32, an assumed failure calculation priority level database DB33), a stabilization calculation result database DB40 (a system state generation result database DB41, a system stability calculation result database DB42, a control table calculation result database DB43), and a control determination input database DB60 (a failure database DB61), and a control determination result database DB70 (a control target determination result database DB71), excluding the stabilization calculation program database DB81 and the control determination program database DB82, will be described.

The system configuration database DB31 stores the system configuration data D31 as system configuration, line impedance (R+jX), ground capacitance (susceptance: jB), data necessary for system configuration and state estimation (for example, threshold value of bat data), generator data, and other data necessary for current calculation, state estimation, and time series change calculation. Note that, when input manually, it is manually input by the input unit 1003 and stored. At the time of input, necessary image data is generated by the CPU 1001 and displayed on the display unit 1005. When inputting, it may be semi-manual so that a large amount of data can be set using the complement function.

FIG. 5 is a diagram illustrating an example of system measurement data D32 stored in the system measurement database DB32. The system measurement database DB32 stores data such as a measurement location D321, a measurement data type D322, and a measurement value D323 as the system measurement data D32.

Among the data, the measurement location D321 is a transmission line A (transmission end), a transmission line A (reception end), a transmission line B (transmission end), a bus line A, a bus line B, and the like.

The measurement data type D322 is active power P, reactive power Q, voltage V, voltage phase angle $\delta$, current I, power factor $\phi$, and the like. The measurement value D323 is a unitized value, for example. The data may be time stamped data or PMU data. For example, there is stored voltage and voltage phase angles at nodes 120B or 120C connected to power system 100, line current (P+jQ) of the branches 140B or 140C connected to the nodes 120B and 120C connected to the power system 100, line current (P+jQ) of the transformers 130A and 130B connected to nodes 120B or 120C connected to power system 100, voltage V and voltage phase angle $\delta$ of the nodes 120A and 120D connected to transformers 130A or 130B, active power P or reactive power Q or power factor $\phi$ of the generator 110A or 110B connected to the node 120A or 120D, and active power P, reactive power Q, power factor $\phi$, voltage V and voltage phase angle $\delta$, and the like of other nodes or branches, generator, load, and controller, and the like connected to the power system 100, measured through the communication network from the measuring apparatus 150 or the monitoring control device 200, and the like. The voltage phase angle $\delta$ may be measured using another measuring device using PMU or GPS. The measuring apparatus is a VT, CT, and the like. The line current (P+jQ) may be calculated from the current I, voltage V, and power factor φ measured by the VT, CT, and the like. The results of estimating and calculating the active power P, the reactive power Q, the voltage V, the voltage phase angle δ, the current I, and the power factor φ of each node, branch, generator, load, and control device of the system, which is the calculation result of the system state generation program P811, are also stored as the system measurement data.

FIG. 6 is a diagram illustrating an example of the assumed failure calculation priority level data D33 stored in the assumed failure calculation priority level database DB33. The assumed failure calculation priority level data D33 is provided with, as the renewable energy output fluctuation scenario D333, a priority level D331 of calculation and a failure type D332, and the failure type D332 is further formed by a failure location D334 and a failure mode D335.

In the case of FIG. 6, the failure location D334 is assumed to be the transmission line A (transmission end), the transmission line B (reception end), the transmission line D (transmission end), and the like, for example, and the failure mode D335 is a combination of phase, the number of lines, and fault condition of the faulty line. In failure mode D335, 3 φ6LG(ABCA'B'C') indicates a three-phase, six-line ground fault in which the A phase, B phase, C phase, A' phase, B' phase, and C' phase are grounded. The priority level D331 here is ranked in the order in which the disturbance of the power system is large and the power system is unstable in the case of the assumed failure.

The renewable energy output fluctuation scenario D333 illustrated in the upper half of FIG. 6 is a case of a renewable energy output fluctuation scenario type A. Accordingly, there are a plurality of scenario types D336, and as illustrated in the lower half of FIG. 6, the renewable energy output fluctuation scenario types D336 are defined by their contents D337. The content D337 for each scenario type D336 is further defined for each of a plurality of points D338, and is defined for each point by data such as the weather D339 and the wind speed D3310. FIG. 6 illustrates that, in the case of renewable energy output fluctuation scenario type A, it is described that the weather D339 at points A and B is partly cloudy, and has the wind speed D3310 of 0 (m/s), and in the case of matching the weather information here, the assumed failure calculation priority level data D33 of the priority level that matches the renewable energy output fluctuation scenario type A is formed.

Accordingly, likewise, when the weather information of the point described in the renewable energy output fluctuation scenario type B is matched, the assumed failure calculation priority level data D33 of the priority level that matches the renewable energy output fluctuation scenario type B is formed. FIG. 6 indicates that the priority level is set for each of the assumed failures, and the priority level of the assumed failure is set to change for each renewable energy output fluctuation scenario type. In other words, when the mode of the renewable energy output fluctuation is changed due to the weather, it means that the priority level is changed according to the weather condition in each case.

Here, the renewable energy output fluctuation scenario type in FIG. 6 is the pattern of the renewable energy output fluctuation most likely to occur, which is obtained by analysis in advance, for example. The past actual data of the renewable energy output fluctuation may be analyzed, and it may be the renewable energy output fluctuation pattern with the largest amount of control (amount of stabilization control) necessary to maintain the stability for each of the assumed failures.

The priority level is in the order of the assumed failures with the largest amount of stabilization control when the renewable energy output fluctuation scenario occurs. It may be in the order of the assumed failures with a greater difference between the amount of stabilization control when the renewable energy output fluctuation scenario occurs and the amount of stabilization control when the renewable energy output fluctuation scenario does not occur is large, or may be in other order. As a result, it is possible to determine the priority level of the system stability calculation for each of the assumed failures at the time of the assumed renewable energy output fluctuation.

When generating the assumed failure calculation priority level database DB33 of FIG. 6, it goes without saying that the renewable energy output fluctuation scenario type is determined according to the weather information of each point of the power system, and the priority level is adjusted variably as appropriate.

FIG. 7 is a diagram illustrating an example of the failure data D61 stored in the failure database DB61. The failure database DB61 stores, as the failure data D61, data such as a failure location D611 and a failure mode D612.

FIG. 8 is a diagram illustrating an example of the system state generation result data D41 stored in the system state generation result database DB41. The system state generation result database DB41 stores, as the system state generation result data D41, data such as a target bus line D411, a type D412 of system state, and a value D413 of system state. The target bus line is a generator bus line, a load bus line, and the like. The types of the system states include active power P, reactive power Q, voltage V, voltage phase angle δ, current I, power factor φ, and the like. The value D413 is a unitized value, for example.

The system stability calculation result database DB42 stores the system stability calculation result data D42 as data such as the stabilization target control calculated as a result of the system stability calculation.

FIG. 9 is a diagram illustrating an example of the control table generation result data D43 stored in the control table generation result database DB43. The control table calculation result database DB43 stores, as control table calculation result data D43, data such as priority level D431 of the calculation, failure type D432, and control target D433. The control target is a generator, a load, and the like. It may be a battery, a secondary battery capable of being rechargeable and discharged, a battery for EV, a fly-wheel, a phase adjustment facility, and the like. Here, the notation "generator G1+G2+G3" in FIG. 9 indicates that the electric controller is the generator G1, the generator G2, and the generator G3, meaning that the generator G1, the generator G2, and the generator G3 are shut off as the control targets.

Returning to FIG. 1, the system state generation result database DB41 in the stabilization calculation result database DB40 of FIG. 1 stores the system state generation result data D41 generated by the system state generation program P811 using the system configuration data D31 and the system measurement data D32. The method of generating the system state will be described below.

The system stability calculation result database DB42 stores the system stability calculation result data D42 generated by the system stability calculation program P812 using the system configuration data D31, the system state generation result data D41, and the assumed failure calculation priority level data D33. The method of calculating the system stability will be described below.

The control table calculation result database DB43 stores the control table calculation result data D43 calculated by the control table calculation program P813 using the system stability calculation result data D42. The method of calculating the control table will be described below.

In the control determination result database DB70 of FIG. 1, the control target determination result database DB71 stores the control target determination result data D71 determined by the control target calculation program P821 using the control table calculation result data D43 and the failure data D61. The method of determining the control target will be described below.

Next, an example of the arithmetic processing content of the power system stabilization device 10 will be described with reference to FIGS. 10 and 11. FIGS. 10 and 11 are flowcharts illustrating an example of entire processing of the power system stabilization device 10, in which FIG. 10 illustrates processing of the central processing device 1000, and FIG. 11 illustrates processing of the processing unit 2000.

First, the flow of processing of the central processing device 1000 will be described with reference to FIG. 10.

In processing step S100, state estimation calculation is performed using the system configuration data D31 and the system measurement data D32, and the result of the state estimation is stored as a system state in the system state generation result database DB41. In the state estimation calculation, each node, branch, generator, load, active power P, reactive power Q, voltage V, voltage phase angle $\delta$, current I, and power factor $\phi$ of the control device are estimated. For example, the method of state estimation calculation is conducted according to the calculation method or the like described in "Power System Stabilization System Engineering", Akihiko Yokoyama, Koji Ota, Institute of Electrical Engineers of Japan, 2014, pp. 49.

In processing step S200, the failure type with the highest priority level is selected from the unselected failure types using the assumed failure calculation priority level data D33 illustrated in FIG. 6.

In processing step S300, the stability of the power system with respect to the failure type selected at processing step S200 is calculated using the system configuration data D31 and the system state generation result data D41, a control target necessary to maintain stability is calculated, and the calculation result is stored in the system stability calculation result data DB42. For example, stability is calculated based on the results of numerical simulation conducted according to the calculation method or the like described in "Power System Stabilization System Engineering", Akihiko Yokoyama, Koji Ota, Institute of Electrical Engineers of Japan, 2014, pp. 54-57. The stability is transient stability, voltage stability, and the like. The calculation index of transient stability is the internal phase angle of the synchronous generator, and the like, and when the deviation from the internal operating angle of the reference generator exceeds a threshold value, transient instability is determined. The calculation index of voltage stability is the stability margin of the PV curve and the like described in "Power System Stabilization System Engineering", Akihiko Yokoyama, Koji Ota, Institute of Electrical Engineers of Japan, 2014, pp. 42-45, and when the stability margin exceeds a threshold value, voltage instability is determined. In the method of calculating the control target, with respect to transient stability, for example, a synchronous generator is set, as a control target, of which deviation of the internal operation angle with the reference generator exceeds a threshold value. It may be conducted according to the method of installation of the on-line TSC system described in "Power System Stabilization System Engineering", Akihiko Yokoyama, Koji Ota, Institute of Electrical Engineers of Japan, 2014, pp. 189-191. With respect to the voltage stability, a synchronous generator of which stability margin of the PV curve exceeds a threshold value is set as a candidate for the control target. The calculation method described above illustrates an example, and other calculation methods may be used.

In processing step S400, a control table is generated using the system stability calculation result data D42, and is stored in the control table calculation result database DB43.

In processing step S500, it is determined whether all the failure types of the assumed failure priority level data D33 are selected at processing step S200. When all the failure types are selected, the processing proceeds to processing step S600. When not selected, the processing returns to step S200.

In processing step S600, the control table is transmitted to the arithmetic unit 2000 using the control table calculation result data D43.

As described above, since the control table may be generated according to the priority level of the assumed failure with respect to the assumed renewable energy output fluctuation scenario, the control target may be calculated preferentially with respect to the failure with a large amount of stabilization control at the time of the occurrence of the renewable energy output fluctuation scenario or the failure with an amount of stabilization control greatly changed depending on the presence or absence of the occurrence of the renewable energy output fluctuation scenario. As a result, appropriate control may be performed with respect to the failure according to the system state.

When a processing cycle (computation cycle) is set in the processing of the central processing device 1000, the processing cycle may end before the series of processing from steps S100 to S600 is completed, in some cases. Here, the control table generation result data D43 at the time when the processing cycle ends is transmitted to the arithmetic unit, at processing step S600. As a result, even when the control tables for all the assumed failures may not be generated, with respect to the failure for which the generation of the control table is completed, appropriate control may be performed according to the system state.

The various calculation results obtained such and data accumulated in the memory during calculation may be sequentially displayed on the screen of the monitoring control device 200. Thereby, the operator may easily check the operation status of the power system stabilization device 10.

Next, the flow of processing of the arithmetic unit 2000 will be described with reference to FIG. 11.

At processing step S700, failure data D61 is received.

At processing step S800, using the failure data D61 and the control table calculation result data D43, the control target with respect to the failure type is determined and stored in the control target determination result database DB71. The control target is a control target corresponding to the same failure type as the failure data D61 described in the control table calculation result data D43.

At processing step 900, a control command is issued to the control target determined at processing step S800.

FIG. 12 is a diagram illustrating an example of screen display of the power system stabilization device according to the first embodiment. Here, an example of specific display content will be described with reference to FIG. 12. FIG. 12 illustrates an assumed failure priority level 253 and a point 254 of the renewable energy, a weather 255, and a wind speed 256, as the renewable energy output fluctuation scenario. In FIG. 12, a system diagram 251 and a legend 252 are also displayed together so that the display format is easy for the user to understand.

As illustrated in FIG. 12, the stabilization calculation result is displayed on the screen of the monitoring control device 200 through the power system stabilization device 10 or the communication network 300, and thus there is an effect that the priority level of stability calculation for each of the assumed failures in the power system 10 may be recognized at a glance.

In the power system stabilization device 10 according to the first embodiment described above, by the central processing device 1000, a system state is generated using the system configuration data D31 and the system data D32, system stability is calculated using the system configuration data D31, the system state generation result data D41, and the assumed failure calculation priority level data D33 to calculate a stabilization control target, control table is calculated using the system stability calculation result data D42, the control table is transmitted to the arithmetic unit using the control table calculation result data D43, and each calculation result is displayed, and by the arithmetic unit 2000, a control target is determined using the failure data D61 and the control table calculation result data D43, and a control command is issued using the control target determination result data D71. In the first embodiment, the assumed failure calculation priority level data D33 takes into account the renewable energy output fluctuation scenario here.

The first embodiment applies the power system stabilization device 10 to a power system, and configures a power system stabilization system.

Second Embodiment

In the first embodiment, the power system stabilization device 10 has been described, which performs the stabilization calculation based on the assumed failure calculation priority level with respect to the renewable energy output fluctuation scenario determined in advance. In the second embodiment, the power system stabilization device will be described, which generates a renewable energy output fluctuation scenario using weather forecast data D35 and renewable energy output fluctuation data D36, to calculate an appropriate priority level of stability calculation for each of the assumed failures according to the system state. The description overlapping with the contents described in FIGS. 1 to 12 will be omitted.

FIG. 13 illustrates an example of a power system stabilization device according to the second embodiment. The power system stabilization device illustrated in FIG. 13 is the power system stabilization device 10 of FIG. 1 to which the weather forecast data D35, the renewable energy output fluctuation data D36, a renewable energy output fluctuation scenario generation unit 26, an assumed failure severity calculation unit 27, an assumed failure calculation priority level calculation unit 28, a renewable energy output fluctuation scenario generation result data D45, an assumed failure severity calculation result data D46, and an assumed failure calculation priority level calculation result data D47 are added. In FIG. 13, the additions are indicated by a thick line.

As input data of the central processing device 1000, the weather forecast data D35 and the renewable energy output fluctuation data D36 are added in addition to the system configuration data D31 and the system measurement data D32.

The input data of the arithmetic unit 2000 is the same as in FIG. 1.

As result data of the central processing device 1000, the renewable energy output fluctuation scenario generation result data D45, the assumed failure severity calculation result data D46 and the assumed failure calculation priority level calculation result data D47 are added in addition to the system state generation result data D41, the system stability calculation result data D42, and the control table calculation result data D43.

The output data of the arithmetic unit 2000 is the same as in FIG. 1.

As functions of central processing device 1000, the renewable energy output fluctuation scenario generation unit 26, the assumed failure severity calculation unit 27 and the assumed failure calculation priority level calculation unit 28 are added in addition to the system state generation unit 21, the system stability calculation unit 22, the control table calculation unit 23, and the control table transmission unit 24.

The renewable energy output fluctuation scenario generation unit 26 generates a renewable energy output fluctuation scenario using the weather forecast data D35, the renewable energy output fluctuation data D36, and the system state generation result data D41, and outputs the renewable energy output fluctuation scenario generation result data D45. The assumed failure severity calculation unit 27 calculates the severity of each of the assumed failures using the system configuration data D31, the system state generation result data D41, and the renewable energy output fluctuation scenario generation result data D45, and outputs the assumed failure severity calculation result data D46. The assumed failure calculation priority level 28 calculates the priority level of stability calculation for each of the assumed failures using the assumed failure severity calculation result data D46, and outputs the assumed failure calculation priority level calculation result data D47.

The function of the arithmetic unit 2000 is the same as that of FIG. 1.

FIG. 14 illustrates an example of a hardware configuration of the power system stabilization device 10 and the overall system configuration of the power system 100 according to the second embodiment, in which the weather forecast database DB35, the renewable energy output fluctuation database DB36, and the renewable energy output fluctuation scenario generation result database DB45, the assumed failure severity calculation result database D46 and the assumed failure calculation priority level calculation result database D47 are added by being connected, through the bus line 91, to the overall configuration diagram of the power system stabilization device 10 and the power system 100 according to the first embodiment illustrated in FIG. 2. In FIG. 14, the additions are indicated by a thick line.

FIG. 15 is a diagram illustrating an example of a configuration of the central processing device 1000, illustrating the contents of program data, in which a renewable energy output fluctuation scenario generation program P816, an assumed failure severity calculation program P817, and an assumed failure calculation priority level calculation program P818 are added to the configuration diagram of the stabilization calculation program database P81 according to the first embodiment illustrated in FIG. 3. In FIG. 15, the additions are indicated by a thick line.

In FIG. 14, the descriptions of the components denoted by the same reference numerals and the portions having the same functions, as those illustrated in FIG. 2 described above will be omitted.

The power system stabilization device 10 stores largely 14 databases DBs. In the following, the description of the database already described is omitted, and the newly added weather forecast database DB35, renewable energy output fluctuation database D36, renewable energy output fluctuation scenario generation result database DB45, assumed failure severity calculation result database DB46, and assumed failure calculation priority level calculation result database DB47 will be described.

The weather forecast data D35 is stored in the weather forecast database DB35. The weather forecast data D35 is weather data such as clear weather, partly cloudy, partly sunny, cloudy, rainy, and the like, wind speed data, and the like at each point, for example. The weather data may be data of the amount of clouds at each point. It may be data in which time is associated with the data.

FIG. 16 is a diagram illustrating an example of the renewable energy output fluctuation data D36 stored in the renewable energy output fluctuation database DB36. The renewable energy output fluctuation database DB36 stores, as the renewable energy output fluctuation data D36, renewable energy location D361, weather type D362, active power fluctuation amount D363 and reactive power fluctuation amount D364 corresponding to each weather type, with respect to photovoltaic power generation, and stores renewable energy location D365, wind speed D366, and active power fluctuation amount D367 and reactive power fluctuation amount D368 corresponding to the wind speed, with respect to wind power generation. Here, the present output (output 0) of D367 in FIG. 16 represents that the output is 0 due to the cut-out of wind power generation or the like. The weather type D362 is weather data of the weather forecast data D35, for example.

FIG. 17 is a diagram illustrating an example of the assumed failure severity calculation result data D46 stored in the assumed failure severity calculation result database DB46. In the assumed failure severity calculation result database DB46, data such as failure type D461 and severity D462 for each of the assumed failures type are stored as the assumed failure severity calculation result data D46. The failure type D461 is data such as the failure location D463 and the failure mode D464. The severity D462 is an index that represents the severity of the stability of the power system with respect to the renewable energy output fluctuation scenario for each of the assumed failures, and is, for example, an amount of stabilization control when the renewable energy output fluctuation scenario occurs. It may be a difference between the amount of stabilization control when the renewable energy output fluctuation scenario occurs and the amount of stabilization control when the renewable energy output fluctuation scenario does not occur, and may be another index.

In the assumed failure calculation priority level calculation result database DB47, the assumed failure calculation priority level calculation result data D47 is recorded as data such as the priority level of stability calculation for each of the assumed failures.

Next, the calculation processing content of the power system stabilization device 10 will be described. The flowchart illustrating the entire processing of the central processing device 1000 is a result of adding FIG. 18 to FIG. 10. Therefore, FIG. 18 will be described below.

FIG. 18 illustrates an example of a flowchart illustrating the entire assumed failure calculation priority level calculation processing in the processing of the central processing device 1000.

The processing step S1000 is the same as the content of processing step S100.

At processing step S1100, using the weather forecast data D35, the renewable energy output fluctuation data D36, and the system state generation result data D41, the renewable energy output fluctuation scenario is generated and stored in the renewable energy output fluctuation scenario generation result database DB45.

Here, the flow of renewable energy output fluctuation scenario generation by processing step S1100 of FIG. 18 will be described with reference to FIG. 19. FIG. 19 illustrates an example of a flowchart illustrating the processing of the renewable energy output fluctuation scenario generation unit 26 of FIG. 13.

At processing step S1101, the renewable energy location stored in the renewable energy output fluctuation data D36 is selected.

At processing step S1102, the output fluctuation time of the renewable energy selected at processing step S1101 is set. When the weather data is associated with the weather forecast data D35, the output fluctuation time is set to a time when the weather or the wind speed changes, and when the weather data is not associated with the weather forecast data D35, the output fluctuation time is set to the current time.

At processing step S1103, from the renewable energy output fluctuation data D36, the active power fluctuation amount and reactive power fluctuation amount corresponding to the weather type and wind speed of the time set at processing step S1101 are set as the output fluctuation amount of the renewable energy at the set time.

At processing step S1104, it is determined whether all the output fluctuation times are selected at processing step S1102. When selected, the processing proceeds to processing step S1105. When not selected, the processing returns to processing step S1102.

At processing step S1105, it is determined whether all the renewable energy locations stored in the renewable energy output fluctuation data D36 are selected at processing step S1101. When selected, the processing ends. When not selected, the processing returns to processing step S1101.

Referring back to FIG. 18, at processing step S1200, the severity of each of the assumed failures is calculated using the system configuration data D31, the system state generation result data D41, and the renewable energy output fluctuation scenario generation result data D45, and stored in the assumed failure severity calculation result database DB46.

Here, the flow of assumed failure severity calculation at processing step S1200 of FIG. 18 will be described with reference to FIG. 20. FIG. 20 illustrates an example of a flowchart illustrating the processing of the assumed failure severity calculation unit 27 of FIG. 13.

At processing step S1201, the system state generated at processing step S1000 is set.

At processing step S1202, an assumed failure to be calculated with respect to the severity is selected.

At processing step S1203, the system state set at processing step S1201 is set as the initial state, the stability of the power system with respect to the assumed failure selected at processing step S1202 is calculated, and the control target necessary to maintain the stability is calculated. The processing step S1202 is the same as the content of processing step S300.

At processing step S1204, for the system state set at processing step S1201, the renewable energy output fluctuation scenario generated at processing step S1100 is set.

At processing step S1205, the stability of the power system is calculated with respect to the renewable energy output fluctuation scenario set at processing step S1204 and the assumed failure selected at processing step S1202, and a control target necessary to maintain the stability is calculated. The processing step S1205 is the same as the content of processing step S300.

At processing step S1206, the amount of change in the control amount with respect to the assumed failure being selected is calculated by subtracting the control amount of the control target calculated at processing step S1203 from the control amount of the control target calculated at processing step S1205, and the calculated amount of change is the severity with respect to the assumed failure being selected.

At processing step S1207, it is determined whether all the assumed failures are selected at processing step S1202. When selected, the processing ends. When not selected, the processing returns to processing step S1202.

Referring back to FIG. 18, at processing step S1300, the priority level of stability calculation for each of the assumed failures is calculated using the assumed failure severity calculation result data D46, and stored in the assumed failure calculation priority level calculation result database DB47. The priority level of the stabilization calculation is in the order of the severity calculated at processing step S1200, for example.

Here, an example of specific display content will be described with reference to FIG. 21. FIG. 21 illustrates basically the same as the display screen (FIG. 12) of the power system stabilization device 10, except the stabilization calculation result 253 being added with severity, and it is a diagram in which, as the renewable energy output fluctuation scenario, the output fluctuation time of the renewable energy and the output fluctuation amount (the active power output fluctuation amount 258 and the reactive power output fluctuation amount 259) are newly added and displayed. By graphically displaying the active power output fluctuation amount 258 and the reactive power output fluctuation amount 259, the output fluctuation time and the output fluctuation amount of each renewable energy may be recognized at a glance.

In the power system stabilization device 10 of the second embodiment described above, by the central processing device 1000, a system state is generated using the system configuration data D31 and the system measurement data D32, a renewable energy output fluctuation scenario is generated using the weather forecast data D35, the renewable energy output fluctuation data D36, and the system state generation result data D41, a severity of each of the assumed failures is calculated using the system configuration data D31, the system state generation result data D41, and the renewable energy output fluctuation scenario generation result data D45, a priority level of stability calculation for each of the assumed failures is calculated using the assumed failure severity calculation result data D46, a system stability is calculated using the system configuration data D31, the system state generation result data D41, and the assumed failure calculation priority level calculation result data D47 to calculate a stabilization control target, a control table is calculated using the system stability calculation result data D42, the control table is transmitted to the arithmetic unit using the control table calculation result data D43, each calculation result is displayed, and by the arithmetic unit 2000, a control target is determined using the failure data D61 and the control table calculation result data D43, and a control command is issued using the control target determination result data D71.

The second embodiment applies the power system stabilization device 10 to a power system, and configures a power system stabilization system.

Third Embodiment

In the first embodiment, the power system stabilization device 10 has been described, which performs the stabilization calculation based on the assumed failure calculation priority level with respect to the renewable energy output fluctuation scenario determined in advance.

In the third embodiment, an example of the power system stabilization device will be described in which, with respect to the assumed failure calculation priority level for the plurality of renewable energy output fluctuation scenarios determined in advance, the assumed failure calculation priority level with respect to the renewable energy output fluctuation scenario according to the system state are selected using the weather forecast data D35. The description overlapping with the contents described in FIGS. 1 to 21 will be omitted.

FIG. 22 illustrates an example of a power system stabilization device according to the third embodiment. The power system stabilization device illustrated in FIG. 22 is obtained by adding, to the power system stabilization device 10 illustrated in FIG. 1, weather forecast data D35, assumed failure calculation priority level table data D37, assumed failure calculation priority level selection unit 29, and assumed failure calculation priority level selection result data D48. In FIG. 22, the additions are indicated by a thick line.

As input data of the central processing device 1000, the weather forecast data D35 and the assumed failure calculation priority level table data D37 are added in addition to the system configuration data D31 and the system measurement data D32.

The input data of the arithmetic unit 2000 is the same as in FIG. 1.

As result data of central processing device 1000, the assumed failure calculation priority level selection result data D48 is added in addition to the system state generation result data D41, the system stability calculation result data D42, and the control table calculation result data D43.

The output data of the arithmetic unit 2000 is the same as in FIG. 1.

As functions of central processing device 1000, the assumed failure calculation priority level selection unit 29 is added in addition to the system state generation unit 21, the system stability calculation unit 22, the control table calculation unit 23, and the control table transmission unit 24. The assumed failure calculation priority level selection unit 29 selects the assumed failure calculation priority level using the weather forecast data D35 and the assumed failure calculation priority level table data D37, and outputs the assumed failure calculation priority level selection result data D48.

The function of the arithmetic unit 2000 is the same as that of FIG. 1.

FIG. 23 illustrates an example of the hardware configuration of the power system stabilization device 10 and the overall system configuration of the power system 100 according to the third embodiment, in which the weather forecast database DB35, the assumed failure calculation priority level table data DB37, and the assumed failure calculation priority level selection result database DB48 added by being connected, through the bus line 91, to the overall configuration diagram of the power system stabilization device 10 and the power system 100 according to the first embodiment illustrated in FIG. 2. In FIG. 23, the additions are indicated by a thick line.

FIG. 24 illustrates a configuration example illustrating the contents of program data of the central processing device 1000, in which an assumed failure calculation priority level selection program P819 is added to the configuration diagram of the stabilization calculation program database P81 according to the first embodiment illustrated in FIG. 3. In FIG. 24, the additions are indicated by a thick line.

In FIG. 23, the descriptions of the components denoted by the same reference numerals and the elements having the same functions as those illustrated in FIGS. 2 and 14 described above will be omitted.

As illustrated in FIG. 23, the power system stabilization device 10 stores largely 12 databases DBs. In the following, the description of the database already described is omitted, and the newly added assumed failure calculation priority level table database DB37 and assumed failure calculation priority level selection result database DB48 will be described.

FIG. 25 is a diagram illustrating an example of the assumed failure calculation priority level table data D37 stored in the assumed failure calculation priority level table database DB37. The assumed failure calculation priority level table database DB37 stores, as the assumed failure calculation priority level table data D37, data such as priority level D371 of calculation, failure types D372, and renewable energy output fluctuation scenario types D374 for each renewable energy output fluctuation scenario D373, and its content D375. The contents of the renewable energy output fluctuation scenario are a point D376, the weather D377, the wind speed D378, and the like at that point.

For example, the priority level of calculation for each renewable energy output fluctuation scenario is determined in the same manner as the priority level in the assumed failure calculation priority level data D35. As a result, it is possible to determine the priority level of the system stabilization calculation of each of the assumed failures with respect to a plurality of assumed renewable energy output fluctuation scenarios.

The assumed failure calculation priority level selection result database DB48 stores the priority level of stability calculation for each of the assumed failures with respect to a renewable energy output fluctuation scenario in which an assumed failure calculation priority level selection result data D48 is selected from a plurality of renewable energy output fluctuation scenarios.

Next, the calculation processing content of the power system stabilization device 10 will be described. The flowchart illustrating the entire processing of the central processing device 1000 is a result of adding FIG. 26 to FIG. 10. Therefore, FIG. 26 will be described below.

FIG. 26 illustrates an example of a flowchart illustrating the entire assumed failure calculation priority level selection processing in the processing of the central processing device 1000.

The processing step S1400 is the same as the contents of processing step S100.

At processing step S1500, using the weather forecast data D35 and the assumed failure calculation priority level table data D37, the assumed failure calculation priority level is selected and stored in the assumed failure calculation priority level selection result database DB48.

FIG. 27 is a detailed flowchart of processing step S1500 in FIG. 26. Here, the flow of assumed failure calculation priority level selection at processing step S1500 of FIG. 26 will be described with reference to FIG. 27.

At processing step S1501, a point in the renewable energy output fluctuation scenario type stored in the assumed failure calculation priority level table data D37 is selected.

At processing step S1502, from among the renewable energy output fluctuation scenario types stored in the assumed failure calculation priority level table data D37, the renewable energy output fluctuation scenario of the same weather as the weather data stored in the weather forecast data D35 is extracted.

At processing step S1503, from among the renewable energy output fluctuation scenario extracted at processing step S1502, the renewable energy output fluctuation scenario of the same wind speed as the wind speed data stored in the weather forecast data D35 is extracted.

At processing step S1504, it is determined whether all the points in the renewable energy output fluctuation scenario type stored in the assumed failure calculation priority level table data D37 at processing step S1501 are selected. When selected, the processing proceeds to processing step S1505. When not selected, the processing returns to processing step S1501.

At processing step S1505, the assumed failure calculation priority level with respect to the renewable energy output fluctuation scenario extracted as a result of processing step S1501 to processing step S1504 is selected.

FIG. 28 is a diagram illustrating an exemplary screen display of the power system stabilization device according to the third embodiment. Here, an example of specific display content will be described with reference to FIG. 28. FIG. 28 illustrates basically the same as the display screen (FIG. 12) of power system stabilization device 10, except a renewable energy output fluctuation scenario type 2510 newly added as a renewable energy output fluctuation scenario. As a result, there is an effect that it may be recognized at a glance whether the assumed failure calculation priority level in the displayed stabilization calculation result is selected based on which kind of renewable energy output fluctuation scenario.

In the power system stabilization device 10 according to the third embodiment described above, by the central processing device 1000, a system state is generated using the system configuration data D31 and the system measurement data D32, the assumed failure calculation priority level is selected using the weather forecast data D35 and the assumed failure calculation priority level table data D37, a system stability is calculated using the system configuration data D31, the system state generation result data D41, and the assumed failure calculation priority level selection result data D48 to calculate a stabilization control target, a control table is calculated using the system stability calculation result data D42, the control table is transmitted to the arithmetic unit using the control table calculation result data D43, each calculation result is displayed, and by the arithmetic unit 2000, a control target is determined using the failure data D61 and the control table calculation result data D43, and a control command is issued using the control target determination result data D71.

The third embodiment applies the power system stabilization device 10 to a power system, and configures a power system stabilization system.

Fourth Embodiment

In the first embodiment, the power system stabilization device 10 has been described, which performs the stabilization calculation based on the assumed failure calculation priority level with respect to the renewable energy output fluctuation scenario determined in advance.

In the fourth embodiment, an example of a power system stabilization device will be described, which calculates the cycle (computation cycle) of stability calculation for each of the assumed failures from the assumed failure calculation priority level with respect to the renewable energy output fluctuation scenario determined in advance, and performs stabilization calculation for each of the assumed failures based on the calculated cycle. The description overlapping with the contents described in FIGS. 1 to 28 will be omitted.

FIG. 29 illustrates an example of a power system stabilization device according to the fourth embodiment. The power system stabilization device 10 illustrated in FIG. 29 is the power system stabilization device 10 illustrated in FIG. 1 to which calculation cycle calculation data D38, an assumed failure calculation cycle calculation unit 210, an assumed failure calculation cycle change unit 211, an assumed failure calculation cycle calculation result data D49, and assumed failure calculation cycle change result data D410 are added. In FIG. 29, the additions are indicated by a thick line.

As input data to the central processing device 1000, the calculation cycle calculation data D38 is added in addition to the system configuration data D31, the system measurement data D32, and the assumed failure calculation priority level data D33.

The input data of the arithmetic unit 2000 is the same as in FIG. 1.

As result data of central processing device 1000, the assumed failure calculation cycle calculation result data D49, and the assumed failure calculation cycle change result data D410 are added in addition the system state generation result data D41, the system stability calculation result data D42, and the control table calculation result data D43.

The output data of the arithmetic unit 2000 is the same as in FIG. 1.

The control table calculation unit 23, the control table transmission unit 24, an assumed failure calculation cycle calculation unit 210, an assumed failure calculation cycle change unit 211 is added in addition to the system state generation unit 21, the system stability calculation unit 22 as functions of the central processing device 1000. The assumed failure calculation cycle calculation unit 210 calculates the calculation cycle of the system stability calculation for each of the assumed failures using the calculation cycle calculation data D38 and the assumed failure calculation priority level data D33, and outputs the assumed failure calculation cycle calculation result data D49. The assumed failure calculation cycle change unit 211 changes the cycle of the system stability calculation for each of the assumed failures using the assumed failure calculation cycle calculation result data D49, and outputs the assumed failure calculation cycle change result data D410.

The function of the arithmetic unit 2000 is the same as that of FIG. 1.

FIG. 30 illustrates an example of a hardware configuration of the power system stabilization device 10 and the overall system configuration of the power system 100 according to the fourth embodiment, in which a calculation cycle calculation database DB38, an assumed failure calculation cycle calculation result database DB49, and an assumed failure calculation cycle change result database DB410 are added by being connected, through the line 91, to the overall configuration diagram of power system stabilization device 10 and power system 100 according to the first embodiment illustrated in FIG. 2. In FIG. 30, the additions are indicated by a thick line.

FIG. 31 is a diagram illustrating an example of the configuration illustrating the contents of program data of central processing device 1000, in which an assumed failure calculation cycle calculation program P8110 and an assumed failure calculation cycle change program P8111 are added to the configuration diagram of the stabilization calculation program database P81 in the first embodiment illustrated in FIG. 3. In FIG. 31, the additions are indicated by a thick line.

In FIG. 30, the descriptions of the components denoted by the same reference numerals and the portions having the same functions, as those illustrated in FIGS. 2, 14, and 23 described above will be omitted.

The power system stabilization device 10 stores largely 13 databases DBs. In the following, the description of the database already described is omitted, and the newly added the calculation cycle calculation database DB38, the assumed failure calculation cycle calculation result database DB49, and the assumed failure calculation cycle change result database DB410 will be described.

The calculation cycle calculation data D38 of the system stabilization calculation is stored in the calculation cycle calculation database DB38 as data such as the priority level D381 and the calculation cycle D382 corresponding thereto as illustrated in FIG. 32. The priority level represents the priority level D331 in the assumed failure calculation priority level data D33. As a result, it is possible to determine the calculation cycle of the system stability calculation with respect to the assumed failure of each priority level. The calculation cycle is shortened as the priority level is higher, for example. Thereby, since assumed failure with a high priority level has shorter update cycle for control target calculated as a result of system stability calculation, the excess/shortage of control caused by the current fluctuation occurring in the update cycle may be prevented.

In the assumed failure calculation cycle calculation result database DB49, the assumed failure calculation cycle calculation result data D49 is stored as data such as each of the assumed failures and a calculation cycle corresponding thereto.

In the assumed failure calculation cycle change result database DB410, the assumed failure calculation cycle change result data D410 is stored as data such as each of the assumed failures and a calculation cycle set for the assumed failure.

Next, the calculation processing content of the power system stabilization device 10 will be described. FIGS. 33 and 34 are examples of a flowchart illustrating the entire processing of the central processing device 1000, and FIG. 33 illustrates an assumed failure calculation cycle calculation processing, and an assumed failure calculation cycle change processing, and FIG. 34 illustrates a system state generation processing, a system stability calculation processing, a control table calculation processing, and a control table transmission processing.

First, the flow of the assumed failure calculation cycle calculation processing and the assumed failure calculation cycle change processing in the central processing device 1000 will be described with reference to FIG. 33.

At processing step S1600, the calculation cycle of stability calculation for each of the assumed failures is calculated using the calculation cycle calculation data D38 and the assumed failure calculation priority level data D33, and is stored in the assumed failure calculation cycle calculation result database DB49.

Here, the flow of assumed failure calculation cycle calculation at processing step S1600 in FIG. 33 will be described with reference to FIG. 35. FIG. 35 illustrates an example of a flowchart illustrating processing of the assumed failure calculation cycle calculation unit 210 of FIG. 29.

At processing step S1601, the failure type stored in the assumed failure calculation priority level data D33 is selected.

At processing step S1602, a priority level with respect to the failure type selected at processing step S1601 is determined.

At processing step S1603, a calculation cycle with respect to the priority level determined at processing step S1602 is extracted from the calculation cycle calculation data D38.

At processing step S1604, the calculation cycle extracted at processing step S1603 is set as the calculation cycle with respect to the assumed failure type selected at processing step S1601.

At processing step S1605, it is determined whether all the failure types stored in the assumed failure calculation priority level data D33 are selected at processing step S1601. When selected, the processing ends. When not selected, the processing returns to processing step S1601.

Referring back to FIG. 33, at processing step S1700, the calculation cycle for each of the assumed failures is changed using the assumed failure calculation cycle calculation result data D49, and is stored in the assumed failure calculation cycle change result database DB410.

Next, the flow of the system state generation processing, the system stability calculation processing, the control table calculation processing, and the control table transmission processing in the central processing device 1000 will be described with reference to FIG. 34. The processing of FIG. 34 is a result of removing processing step S200 and processing step S500 from the processing of FIG. 10, and the processing of FIG. 34 is performed for each of the assumed failures at the calculation cycle set at processing step S1700. As a result, for each of the assumed failures, the control table may be generated sequentially at the calculation cycle set at processing step S1700, and may be transmitted to the arithmetic unit 2000.

Here, an example of specific display content will be described with reference to FIG. 36. FIG. 36 illustrates basically the same as the display screen (FIG. 12) of the power system stabilization device 10, except the assumed failure calculation priority level 253 being added with a calculation cycle. As a result, there is an effect that the calculation cycle of each of the assumed failures in the displayed stabilization calculation result may be recognized at a glance.

In the power system stabilization device 10 according to the fourth embodiment described above, by the central processing device 1000, a system state is generated using the system configuration data D31 and the system measurement data D32, the assumed failure calculation cycle is calculated using the calculation cycle calculation data D38 and the assumed failure calculation priority level data D33, the calculation cycle of the system stability for each of the assumed failures is changed using the assumed failure calculation cycle calculation result data D49, system stability is calculated using the system configuration data D31, the system state generation result data D41, and the assumed failure calculation cycle change result data D410 to calculate a stabilization control target, a control table is calculated using the system stability calculation result data D42, the control table is transmitted to the arithmetic unit using the control table calculation result data D43, each calculation result is displayed, and by the arithmetic unit 2000, a control target is determined using the failure data D61 and the control table calculation result data D43, and a control command is issued using the control target determination result data D71.

The fourth embodiment applies the power system stabilization device 10 to a power system, and configures a power system stabilization system.

REFERENCE SIGNS LIST

10: power system stabilization device,
1000: central processing device
1001: CPU of central processing device
1002: memory of central processing device
1003: input unit of central processing device
1004: communication unit of central processing device
1005: display unit of central processing device
91: bus line of central processing device
2000: arithmetic unit
2001: CPU of arithmetic unit
2002: memory of arithmetic unit
2004: communication unit of arithmetic unit
92: bus line of arithmetic unit
100: power system
110A, 110B: generator
120A, 120B, 120C, 120D: node (bus line)
130A, 130B: transformer
140A, 140B, 140C, 140D: branch (line)
150: measuring apparatus
200: monitoring control device
300: communication network
20: stabilization calculation unit
21: system state generation unit
22: system stability calculation unit
23: control table calculation unit
24: control table transmission unit
25: display unit
D30: stabilization calculation input data
DB30: stabilization calculation input database
D31: system configuration data
DB31: system configuration database
D32: system measurement data
DB32: system measurement database
D33: assumed failure calculation priority level data
DB33: assumed failure calculation priority level database
D35: weather forecast data
DB35: weather forecast database
D36: renewable energy output fluctuation data
DB36; renewable energy output fluctuation database
D37: assumed failure calculation priority level table data
DB37: assumed failure calculation priority level table database
D38: calculation cycle calculation data
DB38: calculation cycle calculation database
D40: stabilization calculation result data
DB40: stabilization calculation result database
D41: system state generation result data
DB41: system state generation result database
D42: system stability calculation result data
DB42: system stability calculation result database
D43: control table calculation result data
DB43: control table calculation result database
D45: output fluctuation scenario for renewable energy generation result data DB45: output fluctuation scenario for renewable energy generation result database
D46: assumed failure severity calculation result data
DB46: assumed failure severity calculation result database
D47: assumed failure calculation priority level calculation result data
DB47: assumed failure calculation priority level calculation result database
D48: assumed failure calculation priority level selection result data
DB 48: assumed failure calculation priority level selection result database
D49: assumed failure calculation cycle calculation result data
DB49 assumed failure calculation cycle calculation result database
D410: assumed failure calculation cycle change result data
DB410 assumed failure calculation cycle change result database
50: control determination unit
51: control target determination unit
52: control command unit
D60: control determination input data
DB60: control determination input database
D61: failure data
DB 61: failure database
D70: control determination result data
DB70: control determination result database
D71: control target determination result data
DB71: control target determination result database
D81: stabilization calculation program data
DB81: stabilization calculation program database
D82: control determination program data
DB 82: control determination program database
P811: system state generation program
P812: system stability calculation program
P813: control table calculation program
P814: control table transmission program
P815: display program
P816: output fluctuation scenario for renewable energy generation program
P817: assumed failure severity calculation program
P818: assumed failure calculation priority level calculation program
P819: assumed failure calculation priority level selection program
P8110: assumed failure calculation cycle calculation program
P8111: assumed failure calculation cycle change program
P821: control target determination program
P822: control command program

The invention claimed is:

1. A power system stabilization device including a central processing device, the central processing device configured to: determine, in advance, a control target device necessary to maintain stability when an assumed failure in a power system including renewable energy occurs by collating a failure type generated in the power system with a control table; execute, for each of a plurality of assumed failures, a computation for determining a control target necessary to maintain the stability at the time of the assumed failure; determine, according to an output fluctuation scenario for renewable energy pertaining to a weather, a degree of priority of executing the computation for determining the control target necessary to maintain the stability at the time of each of the assumed failures; and send a control signal to the control target to control a generator that functions as a power source at the control target and operate the generator based on the control signal when the assumed failure in the power system occurs, receive weather data regarding the weather at the power system as measured, and according to the output fluctuation scenario for the renewable energy pertaining to past weather based on the measured weather, the degree of priority is determined for executing the computation for determining the control target necessary to maintain the stability at the time of each of the assumed failures.

2. The power system stabilization device according to claim 1, wherein for each of the assumed failures, an index is determined that represents a severity of the stability of the power system with respect to the output fluctuation scenario for renewable energy, and according to the index representing the severity, the degree of priority is determined for executing the computation for determining the control target necessary to maintain the stability at the time of each of the assumed failures.

3. The power system stabilization device according to claim 1, wherein according to the degree of priority, a computation cycle of executing the computation for determining the control target necessary to maintain the stability at the time of each of the assumed failures is varied.

4. The power system stabilization device according to claim 1, wherein the power system stabilization device is provided with a display device, and the display device displays, on a screen thereof, a system diagram of the power system, and, for each degree of priority, an assumed failure type and the output fluctuation scenario for renewable energy pertaining to the weather.

5. The power system stabilization device according to claim 1, wherein the central processing device is further configured to:
generate an output fluctuation scenario for each renewable energy using weather forecast data and renewable energy output fluctuation data.

6. A power system stabilization method comprising the steps of: determining, in advance, a control target device necessary to maintain stability when an assumed failure in a power system including renewable energy occurs by collating a failure type generated in the power system with a control table;
executing, for each of a plurality of assumed failures, a computation for determining a control target necessary to maintain stability at the time of the assumed failure; determining, according to an output fluctuation scenario for the renewable energy pertaining to a weather, a degree of priority of executing the computation for determining the control target necessary to maintain stability at the time of each of the assumed failures; measuring the weather at the power system; determining, according to the output fluctuation scenario for renewable energy pertaining to past weather in the power system based on the measured weather, the degree of priority for executing the computation for determining the control target necessary to maintain stability at the time of each of the assumed failures; and sending a control signal to the control target to control a generator that functions as a power source at the control target and operate the generator based on the control signal when the assumed failure in the power system occurs.

7. The power system stabilization method according to claim 6, further comprising: determining, for each of the assumed failures, an index representing a severity of stability of the power system with respect to the output fluctuation scenario for renewable energy, and determining, according to the index representing the severity, the degree of priority for executing a computation for determining a control target necessary to maintain stability at the time of each of the assumed failures.

8. The power system stabilization method according to claim 6, further comprising:
   according to the degree of priority, varying a computation cycle to execute the computation for determining the control target necessary to maintain the stability at the time of each of the assumed failures.

9. The power system stabilization method according to claim 6, further comprising the step of: generating an output fluctuation scenario for each renewable energy using weather forecast data and renewable energy output fluctuation data.

* * * * *